US011121144B2

(12) United States Patent
Bhushan et al.

(10) Patent No.: US 11,121,144 B2
(45) Date of Patent: Sep. 14, 2021

(54) MEMORY ARRAYS AND METHODS USED IN FORMING A MEMORY ARRAY COMPRISING STRINGS OF MEMORY CELLS

(71) Applicant: Micron Technology, Inc., Boise, ID (US)

(72) Inventors: Bharat Bhushan, Singapore (SG); David Daycock, Singapore (SG); Subramanian Krishnan, Singapore (SG); Leroy Ekarista Wibowo, Singapore (SG)

(73) Assignee: Micron Technology, Inc., Boise, ID (US)

( * ) Notice: Subject to any disclaimer, the term of this patent is extended or adjusted under 35 U.S.C. 154(b) by 41 days.

(21) Appl. No.: 16/682,544

(22) Filed: Nov. 13, 2019

(65) Prior Publication Data

US 2021/0143164 A1    May 13, 2021

(51) Int. Cl.
*H01L 27/11556* (2017.01)
*H01L 27/11582* (2017.01)
(Continued)

(52) U.S. Cl.
CPC ... *H01L 27/11556* (2013.01); *H01L 21/31111* (2013.01); *H01L 21/32133* (2013.01);
(Continued)

(58) Field of Classification Search
CPC ......... H01L 21/76802; H01L 21/76877; H01L 27/11556; H01L 27/11582; H01L 23/5226
See application file for complete search history.

(56) References Cited

U.S. PATENT DOCUMENTS

| 5,189,504 A | 2/1993 | Nakayama et al. |
| 6,949,829 B2 | 9/2005 | Akahori et al. |

(Continued)

FOREIGN PATENT DOCUMENTS

| TW | 530380 | 5/2003 |
| WO | WO 2018/174966 | 9/2018 |

OTHER PUBLICATIONS

U.S. Appl. No. 16/682,349, filed Nov. 13, 2019, by Kong et al.
(Continued)

*Primary Examiner* — Zandra V Smith
*Assistant Examiner* — John M Parker
(74) *Attorney, Agent, or Firm* — Wells St. John P.S.

(57) ABSTRACT

A method used in forming a memory array comprises forming a stack comprising vertically-alternating first tiers and second tiers. First insulator material is above the stack. The first insulator material comprises at least one of (a) and (b), where (a): silicon, nitrogen, and one or more of carbon, oxygen, boron, and phosphorus, and (b): silicon carbide. Channel-material strings are in and upwardly project from an uppermost material that is directly above the stack. Conducting material is directly against laterally-inner sides of individual of the upwardly-projecting channel-material strings and project upwardly from the individual upwardly-projecting channel-material strings. A ring comprising insulating material is formed individually circumferentially about the upwardly-projecting conducting material. Second insulator material is formed above the first insulator material, the ring, and the upwardly-projecting conducting material. The first and second insulator materials comprise different compositions relative one another. Conductive vias are formed in the second insulator material that are individually directly electrically coupled to the individual channel-material strings through the upwardly-projecting con-
(Continued)

ducting material. Other embodiments, including structure, are disclosed.

35 Claims, 25 Drawing Sheets

(51) Int. Cl.
    *H01L 27/11524*     (2017.01)
    *H01L 27/1157*     (2017.01)
    *H01L 27/11573*     (2017.01)
    *H01L 21/311*     (2006.01)
    *H01L 21/3213*     (2006.01)
    *H01L 27/11526*     (2017.01)
    *H01L 27/11565*     (2017.01)
    *H01L 27/11519*     (2017.01)

(52) U.S. Cl.
    CPC .... *H01L 27/1157* (2013.01); *H01L 27/11524* (2013.01); *H01L 27/11526* (2013.01); *H01L 27/11573* (2013.01); *H01L 27/11582* (2013.01); *H01L 27/11519* (2013.01); *H01L 27/11565* (2013.01)

(56) References Cited

U.S. PATENT DOCUMENTS

| | | | |
|---|---|---|---|
| 8,987,805 B2 | 3/2015 | Nam et al. | |
| 9,922,987 B1 | 3/2018 | Mizuntani et al. | |
| 10,475,794 B1* | 11/2019 | Wu | H01L 27/10885 |
| 2004/0041266 A1 | 3/2004 | Akahori et al. | |
| 2008/0108193 A1 | 5/2008 | You et al. | |
| 2009/0310425 A1* | 12/2009 | Sim | G11C 16/26 365/185.29 |
| 2010/0109072 A1 | 5/2010 | Kidoh et al. | |
| 2010/0140684 A1 | 6/2010 | Ozawa | |
| 2011/0049607 A1 | 3/2011 | Yahashi | |
| 2011/0287612 A1 | 11/2011 | Lee et al. | |
| 2012/0211816 A1 | 8/2012 | Yahashi | |
| 2012/0228697 A1 | 9/2012 | Youm et al. | |
| 2012/0235163 A1 | 9/2012 | Watanabe | |
| 2012/0299117 A1 | 11/2012 | Lee et al. | |
| 2013/0161731 A1 | 6/2013 | Bin et al. | |
| 2013/0164922 A1 | 6/2013 | Cho et al. | |
| 2013/0270631 A1 | 10/2013 | Kim et al. | |
| 2014/0312398 A1 | 10/2014 | Ching et al. | |
| 2015/0194441 A1 | 7/2015 | Yatsuda et al. | |
| 2015/0236038 A1 | 8/2015 | Pachamuthu et al. | |
| 2015/0255486 A1 | 9/2015 | Kameoka et al. | |
| 2015/0340376 A1 | 11/2015 | Park et al. | |
| 2015/0364488 A1 | 12/2015 | Pachamuthu et al. | |
| 2015/0372005 A1 | 12/2015 | Yon et al. | |
| 2016/0008692 A1 | 1/2016 | Townsend | |
| 2016/0043100 A1 | 2/2016 | Lee et al. | |
| 2016/0071861 A1 | 3/2016 | Serov et al. | |
| 2016/0093524 A1 | 3/2016 | Izumi et al. | |
| 2016/0233224 A1* | 8/2016 | Rhie | H01L 27/11582 |
| 2016/0260735 A1 | 9/2016 | Lee et al. | |
| 2016/0268297 A1* | 9/2016 | Murakami | H01L 29/66833 |
| 2016/0315095 A1 | 10/2016 | Sei et al. | |
| 2017/0256558 A1 | 9/2017 | Zhang et al. | |
| 2017/0263556 A1 | 9/2017 | Tessariol et al. | |
| 2017/0301685 A1 | 10/2017 | Dorhout et al. | |
| 2017/0301686 A1 | 10/2017 | Imamura et al. | |
| 2019/0333937 A1 | 10/2019 | Choi et al. | |
| 2020/0273501 A1 | 8/2020 | Yun et al. | |

OTHER PUBLICATIONS

U.S. Appl. No. 16/230,382, filed Dec. 21, 2018, by Dorhout et al.
U.S. Appl. No. 16/675,901, filed Nov. 6, 2019, by Hopkins et al.

* cited by examiner

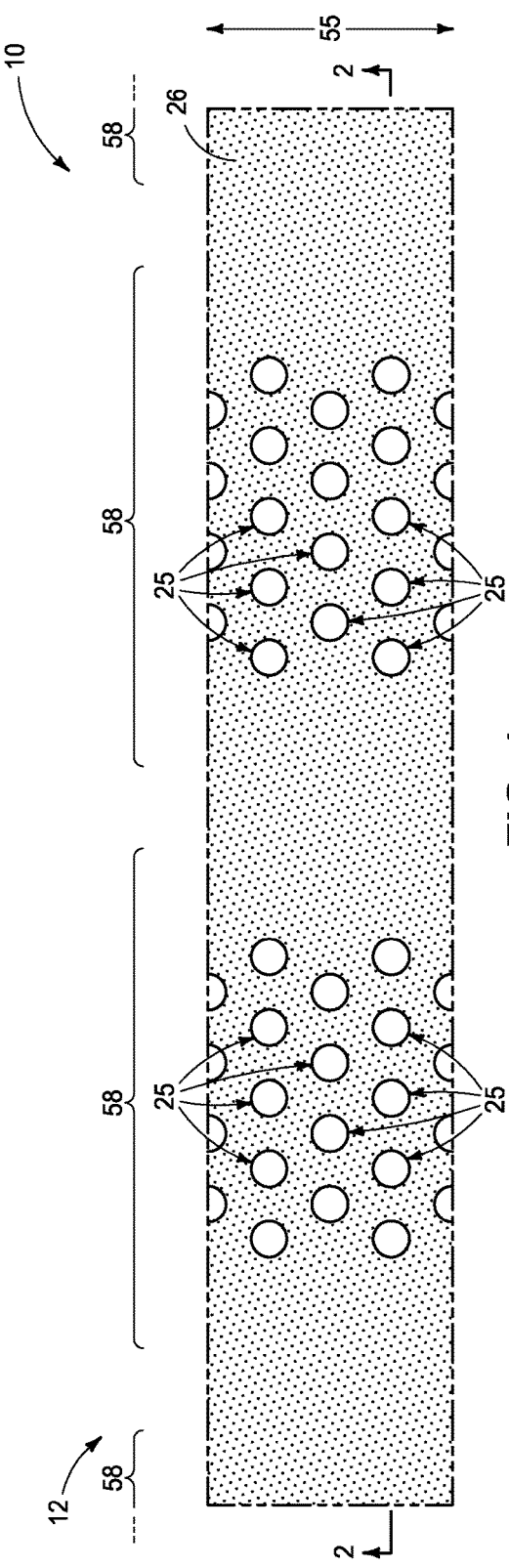
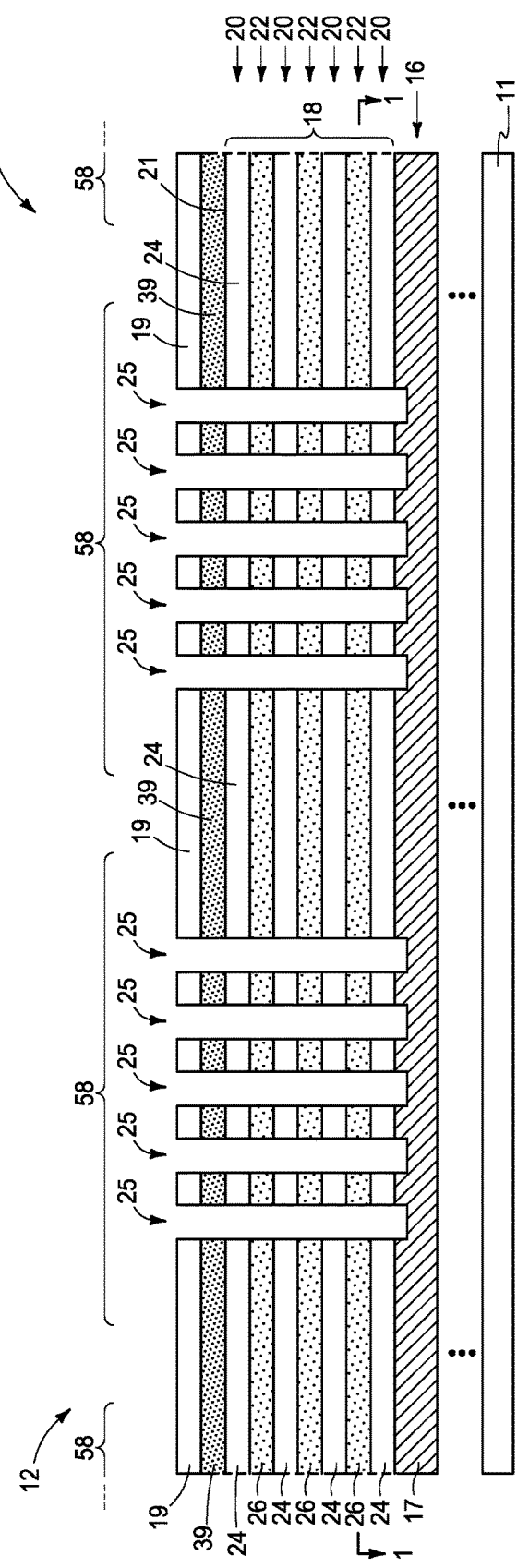

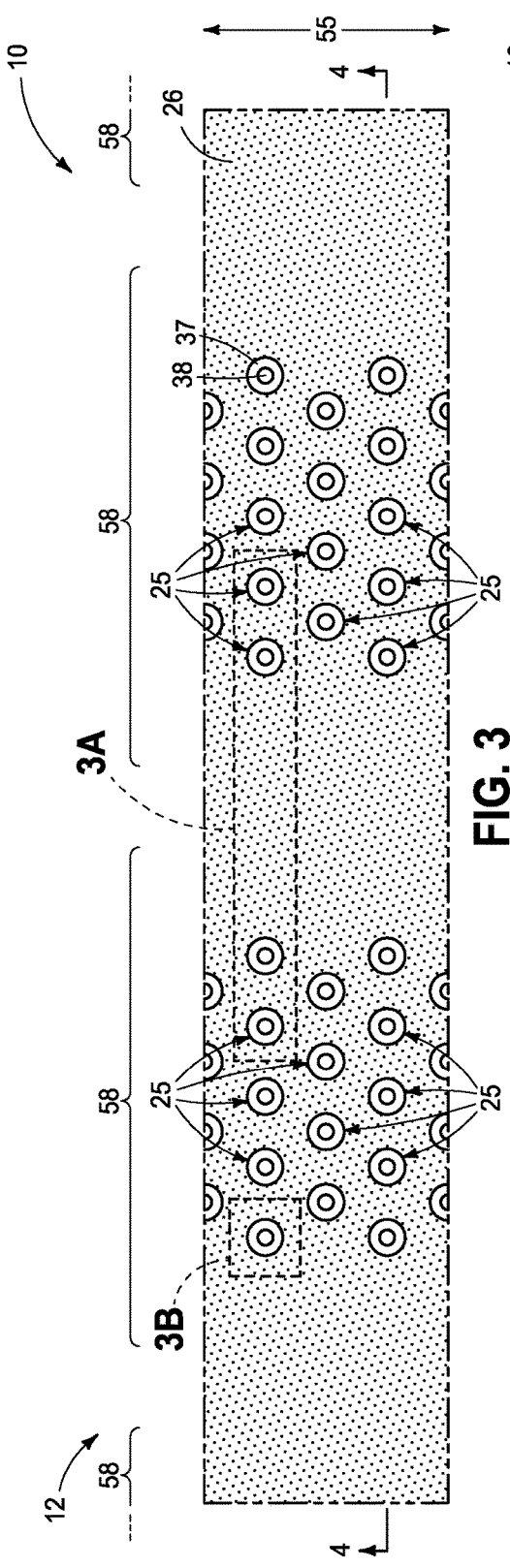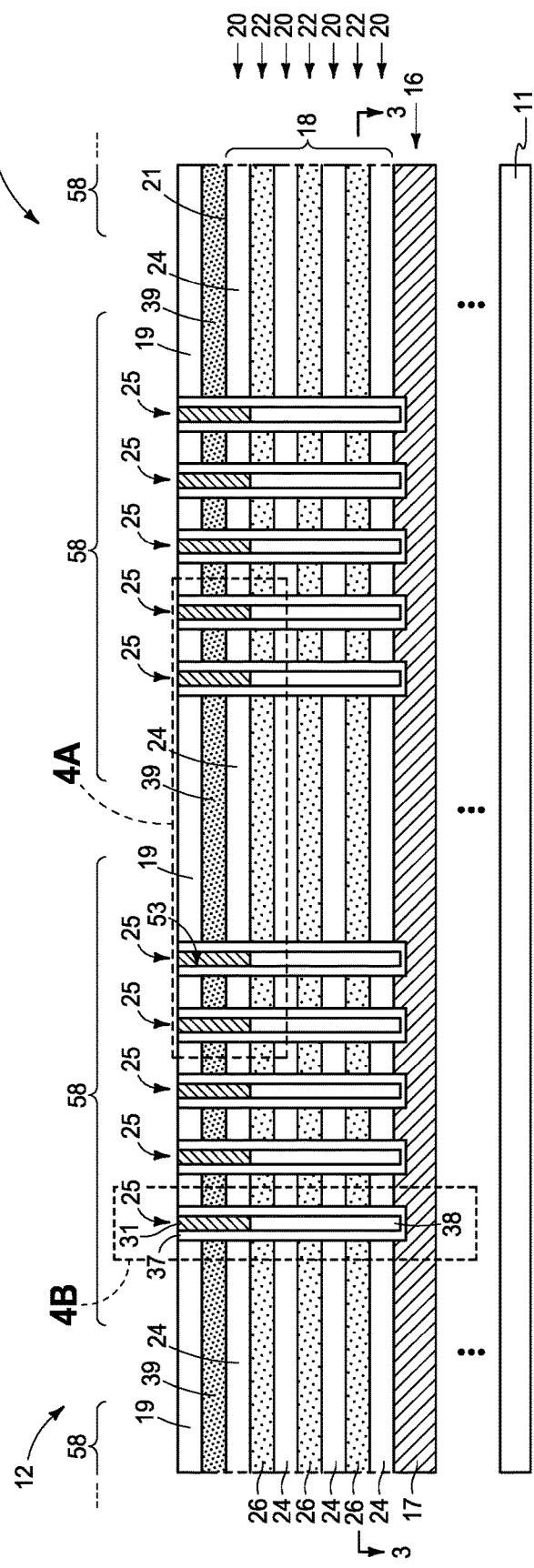
FIG. 3
FIG. 4

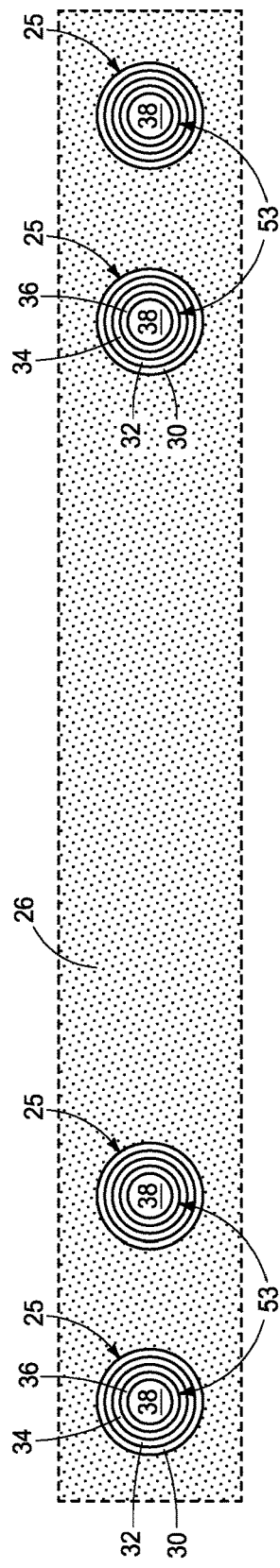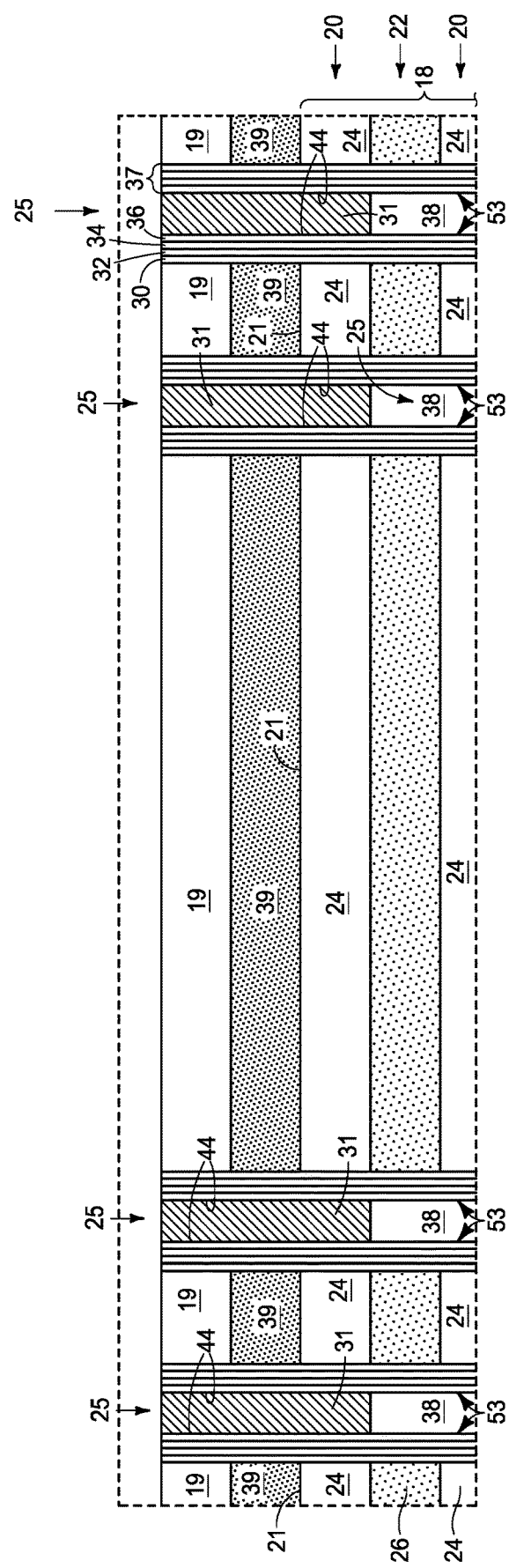

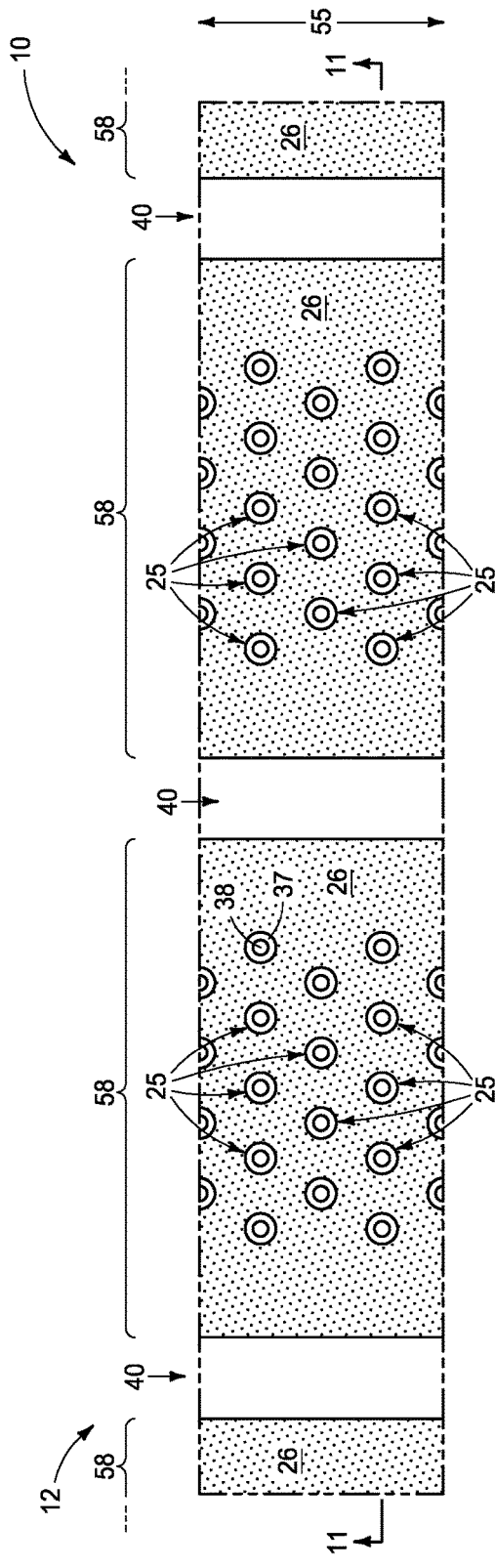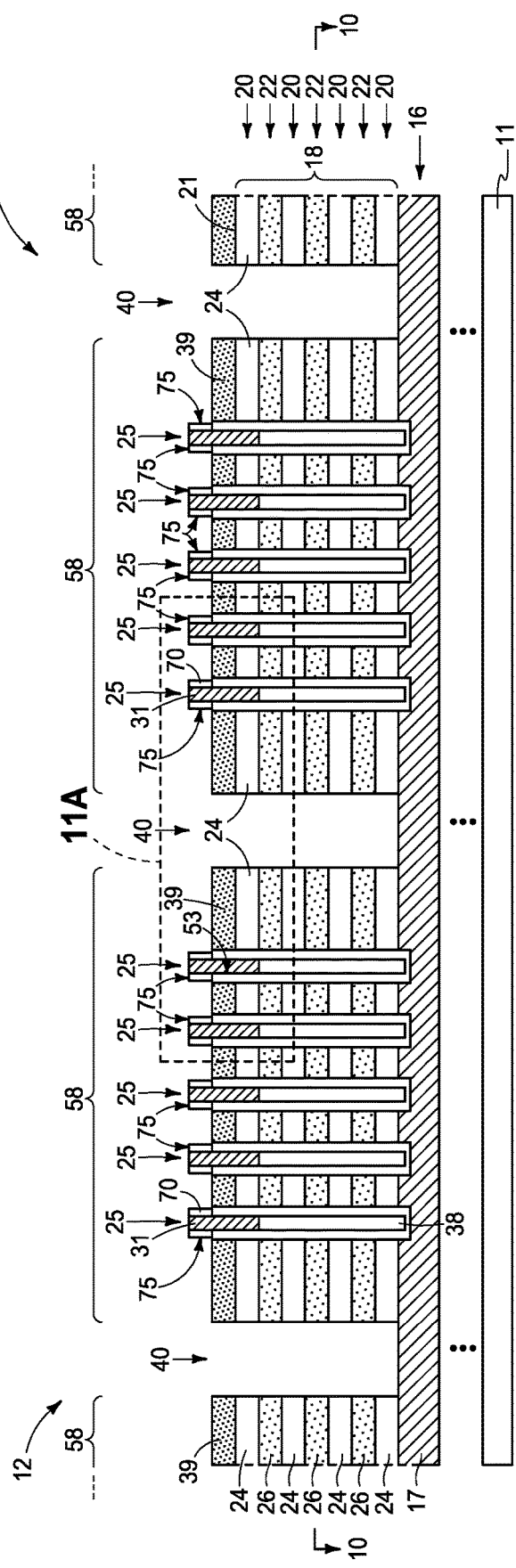

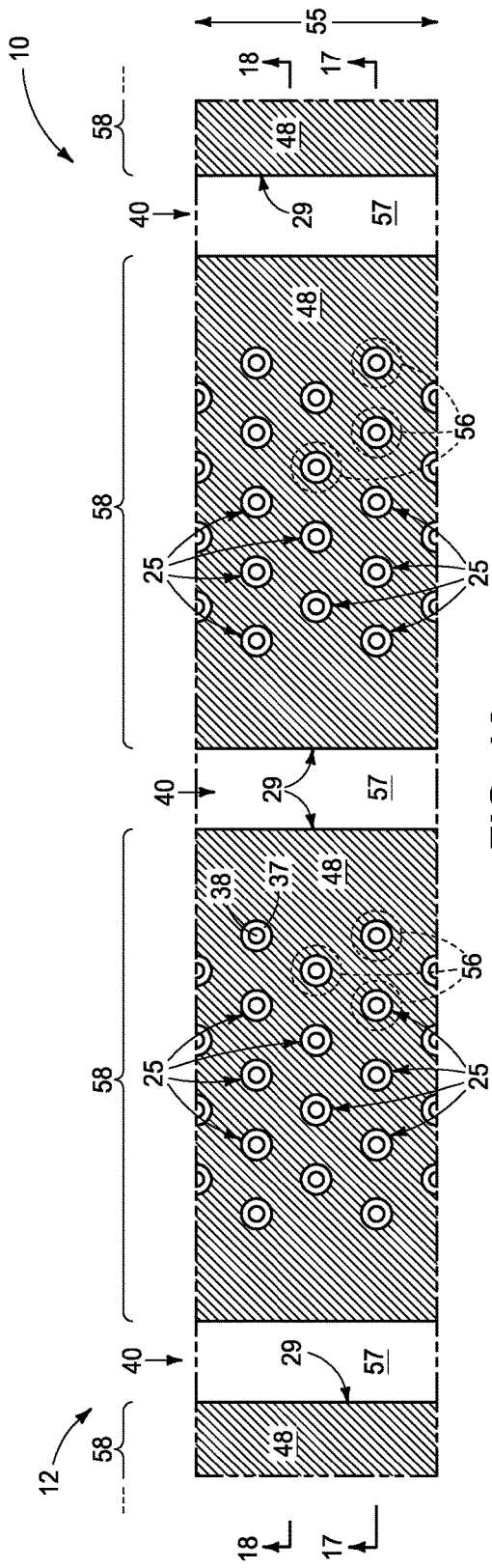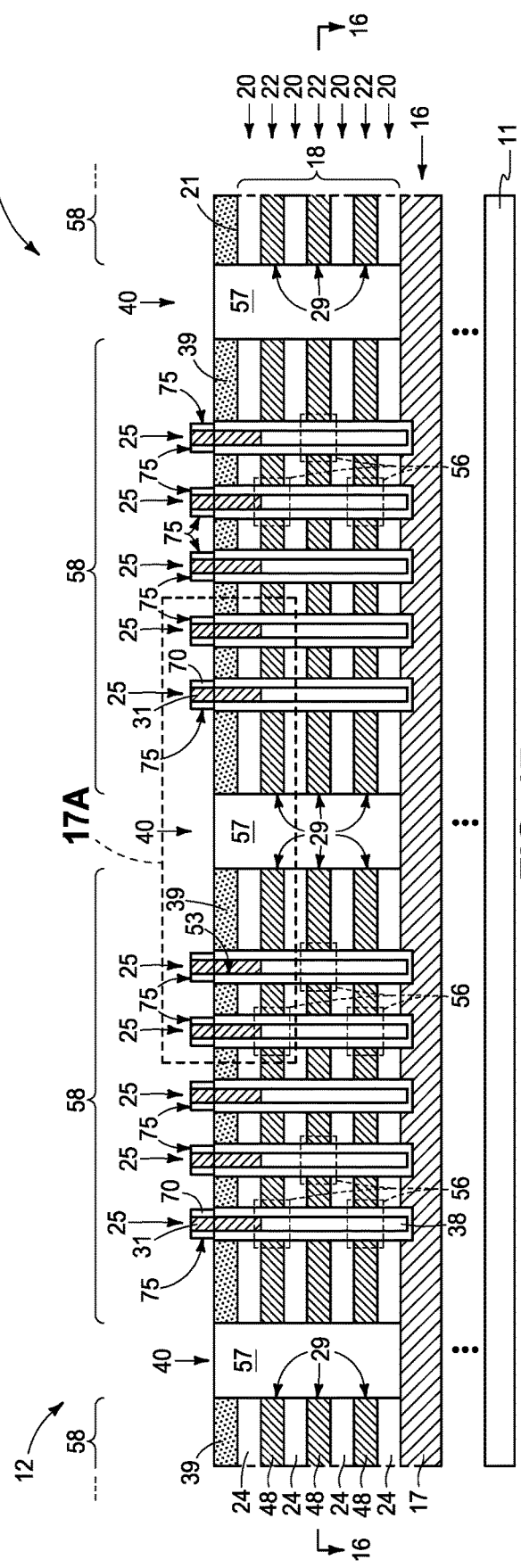

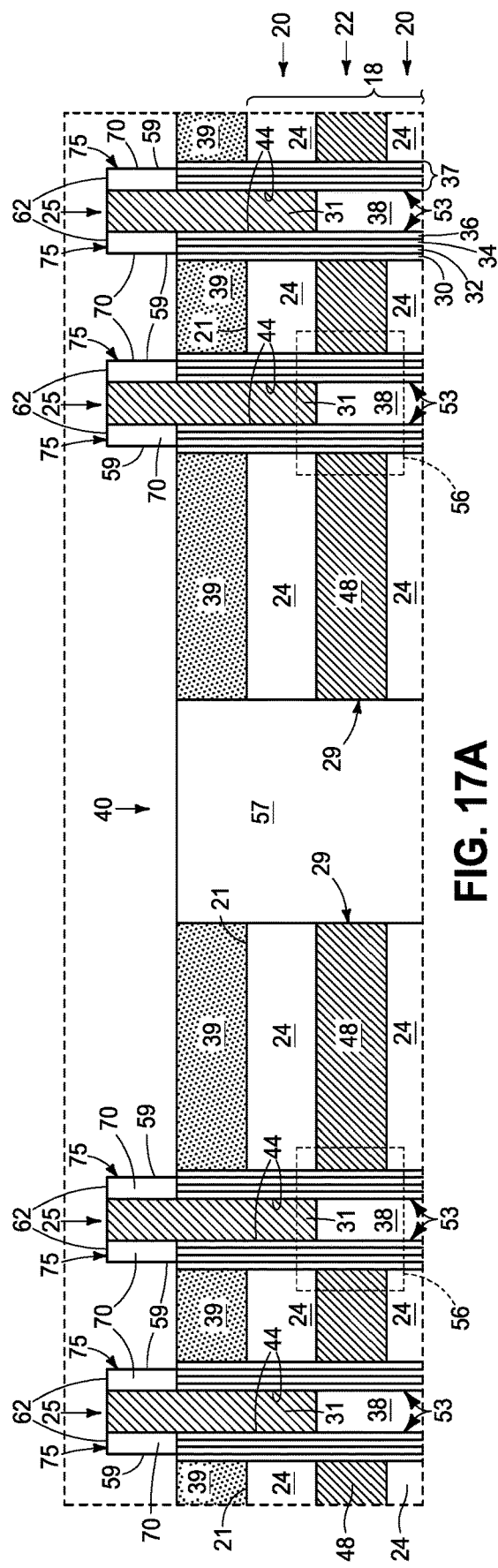
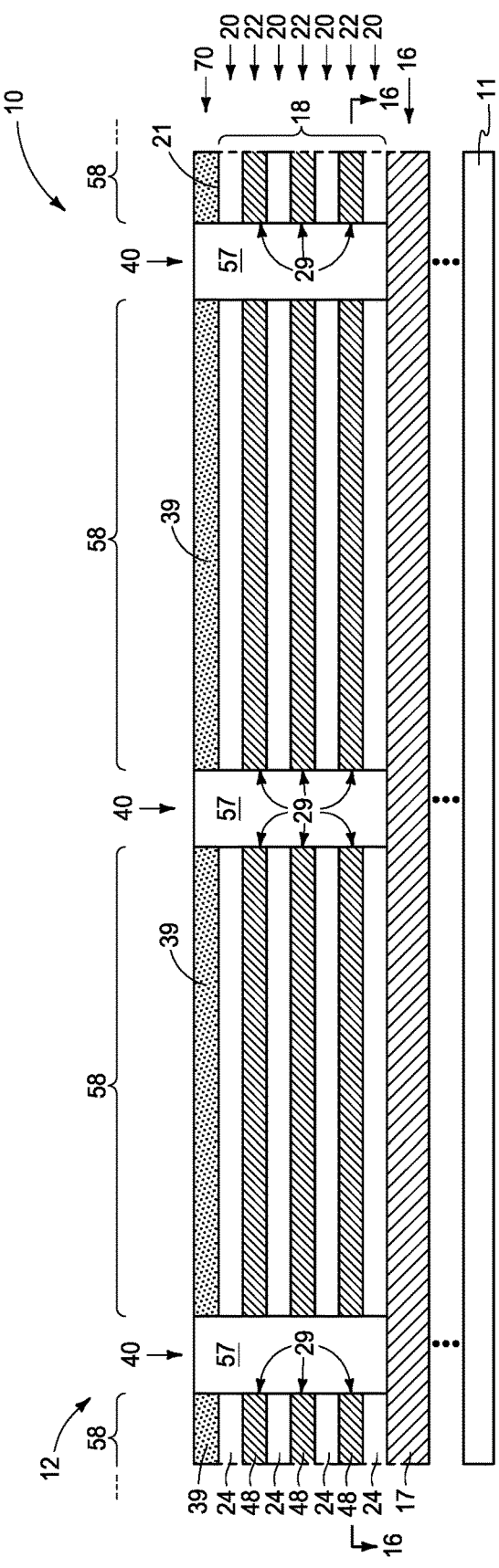
FIG. 17A
FIG. 18

US 11,121,144 B2

MEMORY ARRAYS AND METHODS USED IN FORMING A MEMORY ARRAY COMPRISING STRINGS OF MEMORY CELLS

TECHNICAL FIELD

Embodiments disclosed herein pertain to memory arrays and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228659, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIG. 1 is a diagrammatic cross-sectional view of a portion of a substrate in process in accordance with an embodiment of the invention and is taken through line 1-1 in FIG. 2.

FIG. 2 is a diagrammatic cross-sectional view taken through line 2-2 in FIG. 1.

FIGS. 3, 3A, 3B, 4, 4A, 4B, 5, 5A, 6, 7, 7A-9A, 10, 11, 11A, 12, 13, 13A, 14-17A, 18, 19, 19A, 20, 21, and 21A are diagrammatic sequential sectional and/or enlarged views of the construction of FIGS. 1 and 2, or portions thereof, in process in accordance with some embodiments of the invention.

DETAILED DESCRIPTION OF EXAMPLE EMBODIMENTS

Figure 4B:
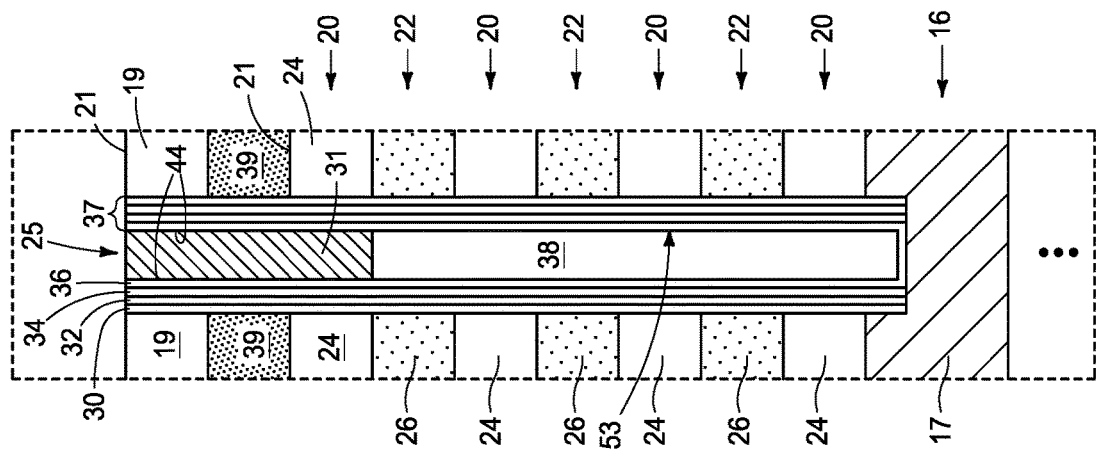
Figure 3B:
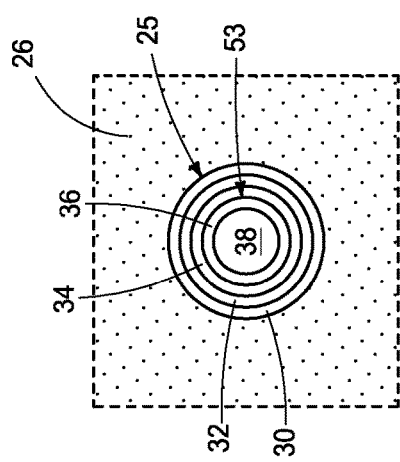

Embodiments of the invention encompass methods used in forming a memory array, for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. Example method embodiments are described with reference to FIGS. 1-21A which may be considered as a "gate-last" or "replacement-gate" process.

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2—depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductive material 17 has been formed above substrate 11. Conductor tier 16 may comprise part of control circuitry (e.g., peripheral-under-array circuitry and/or a common source line or plate) used to control read and write access to the transistors and/or memory cells that will be formed within array 12. A stack 18 comprising vertically-alternating insulative tiers 20 and conductive tiers 22 has been formed above conductor tier 16. Example thickness for each of tiers 20 and 22 is 22 to 60 nanometers. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22. Regardless, conductive tiers 22 (alternately referred to as first tiers) may not comprise conducting material and insulative tiers 20 (alternately referred to as second tiers) may not comprise insulative material or be insulative at this point in processing in conjunction with the hereby initially-described example method embodiment which is "gate-last" or "replacement-gate". Example conductive tiers 22 comprise first material 26 (e.g., silicon nitride) which may be wholly or partially sacrificial. Example insulative tiers 20 comprise second material 24 (e.g., silicon dioxide) that is of different composition from that of first material 26 and which may be wholly or partially sacrificial. Uppermost insulative tier 20 and stack 18 may be considered as having a top 21.

First insulator material 39 has been formed above top 21 of stack 18 and insulator material 19 (e.g., silicon dioxide) has been formed above first insulator material 39. First insulator material 39 comprises at least one of (a) and (b), where (a): silicon, nitrogen, and one or more of carbon, oxygen, boron, and phosphorus, and (b): silicon carbide. In one embodiment, first insulator material 39 comprises the (a). In one such embodiment, first insulator material 39 comprises one and only one of carbon, oxygen, boron, or phosphorus. In another such embodiment, first insulator material 39 comprises at least two of carbon, oxygen, boron, and phosphorus. In one embodiment, the one or more of carbon, oxygen, boron, and phosphorous in first insulator material 39 has a total concentration of at least about 2 atomic percent, and in one such embodiment such total concentration is no more than about 20 atomic percent. In one embodiment, such total concentration is at least about 4 atomic percent, and in one embodiment is at least about 10 atomic percent. In one embodiment, such total concentration is from about 6 atomic percent to about 11 atomic percent. In one embodiment, first insulator material 39 comprises the (b). In one embodiment, first insulator material 39 comprises both of the (a) and the (b), and another embodiment comprises only one of the (a) and the (b). In one embodiment, insulative tiers 20 comprise insulative material (e.g., 24) that is of different composition from that of first insulator material 39. Regardless, first insulator material may be deposited to any suitable thickness, with 100 to 600 Angstroms being an example.

Channel openings 25 have been formed (e.g., by etching) through insulator material 19, first insulator material 39, insulative tiers 20, and conductive tiers 22 to conductor tier 16. Channel openings 25 may taper radially-inward (not shown) moving deeper in stack 18. In some embodiments, channel openings 25 may go partially into conductive material 17 of conductor tier 16 as shown or may stop there-atop (not shown). Alternately, as an example, channel openings 25 may stop atop or within the lowest insulative tier 20. A reason for extending channel openings 25 at least to conductive material 17 of conductor tier 16 is to assure direct electrical coupling of subsequently-formed channel material (not yet shown) to conductor tier 16 without using alternative processing and structure to do so when such a connection is desired. Etch-stop material (not shown) may be within or atop conductive material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row and being arrayed in laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a direction 55. Memory-block regions 58 may otherwise not be discernable at this point of processing. Any alternate existing or future-developed arrangement and construction may be used.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array may formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 3, 3A, 3B, 4, 4A, and 4B show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18 and within individual channel openings 25 followed by planarizing such back at least to a top surface of stack 18. In one embodiment, at least some of memory-cell materials 30, 32, and/or 34 comprising silicon dioxide, and further example memory-cell materials are described in more detail below.

Channel material 36 has also been formed in channel openings 25 elevationally along insulative tiers 20 and conductive tiers 22, thus comprising individual operative channel-material strings 53 in one embodiment having memory-cell materials (e.g., 30, 32, and 34) there-along and with second-tier material (e.g., 24) being horizontally-between immediately-adjacent channel-material strings 53. Materials 30, 32, 34, and 36 are collectively shown as and only designated as material 37 in FIGS. 3 and 4 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 is directly against conductive material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductive material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown). Regardless, conducting material 31 (e.g., a conductive plug such as conductively-doped polysilicon) is directly against laterally-inner sides 44 in an upper portion of individual channel-material strings 53. One or more of materials 30, 32, 34, and 36 may not extend to the top of conducting material 31 (not shown)

Figure 5:
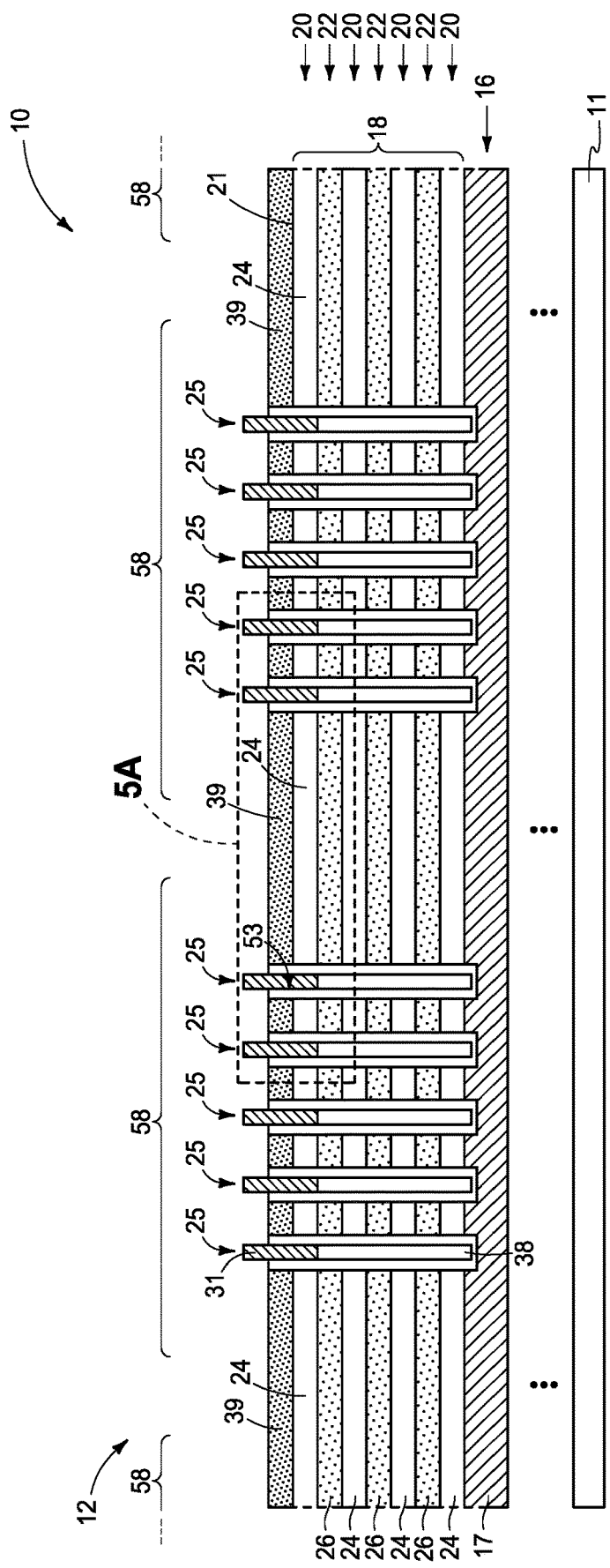
Figure 5A:
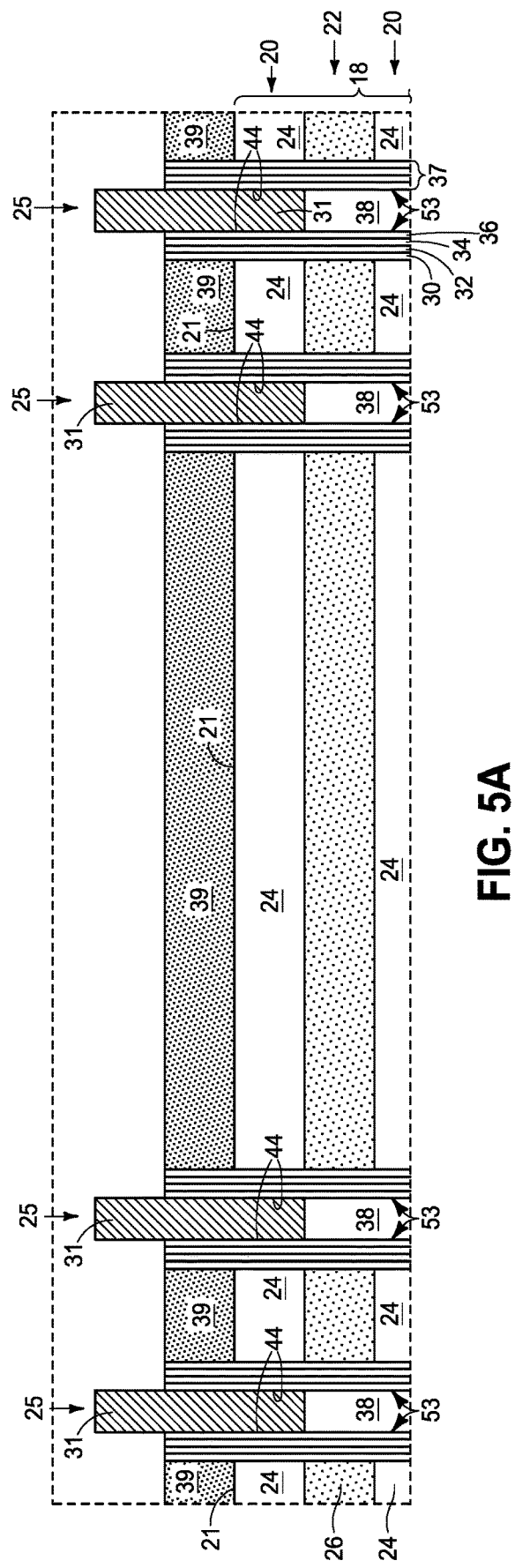

Referring to FIGS. 5 and 5A, insulator material 19 (not shown) has been removed back (e.g., by etching) to first insulator material 39. Such has resulted in channel-material strings 53 projecting upwardly from an uppermost material that is directly above stack 18. In such example, such uppermost material is at least first insulator material 39. Alternately, and by way of example only, if not all of insulator material 19 was removed (not shown), such remaining insulator material 19 would at least be such uppermost material. Additionally, memory-cell materials 30, 32, and 34, and channel material 36, have been vertically recessed (e.g., by etching) such that conducting material 31 now projects upwardly from individual upwardly-projecting channel-material strings 53. As an example, consider an embodiment where memory-cell materials 30, 32, and 34 individually are one or more of silicon dioxide and silicon nitride layers. In such an example embodiment, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF solution will etch silicon nitride selectively relative to silicon dioxide. Accordingly, and in such example, such etching chemistries can be used in an alternating manner to sequentially remove memory-cell materials 30, 32, and 34 from being laterally/radially outward of channel material 36. Then, channel material 36 can be removed, for example by etching. As an example, and by way of example only, conductively-doped polysilicon as a channel material 36 can be wet etched using solution of $HNO_3/H_2O/HF$ (50:20:1, by volume) or dry plasma etched using $SF_6$. The artisan is capable of selecting other chemistries for etching other different materials. One or more of materials 30, 32, and 34 may be etched such that their tops are below the top of first insulator material 39 (not shown)

The above described and shown embodiments are but examples of manners of forming channel-material strings 53 to project upwardly from an uppermost material that is directly above first insulator material 39, and to form conducting material 31 to projecting upwardly from individual upwardly-projecting channel-material strings 53. Any other existing or future-developed techniques may be used.

Figure 6:
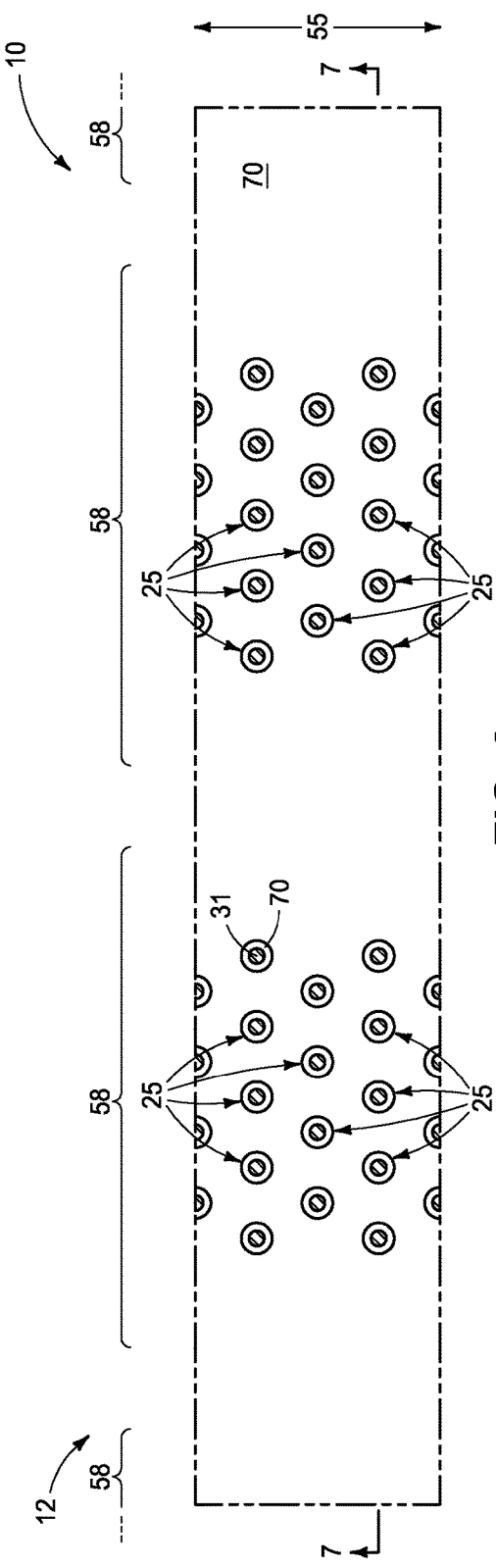
Figure 7:
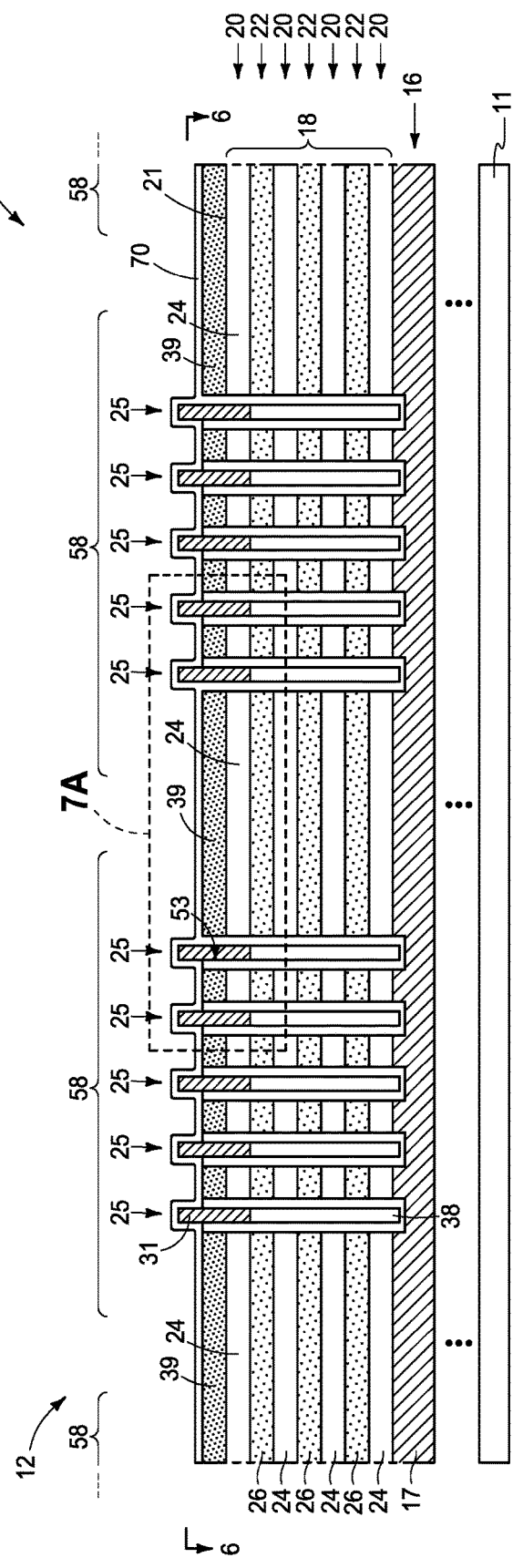
Figure 7A:
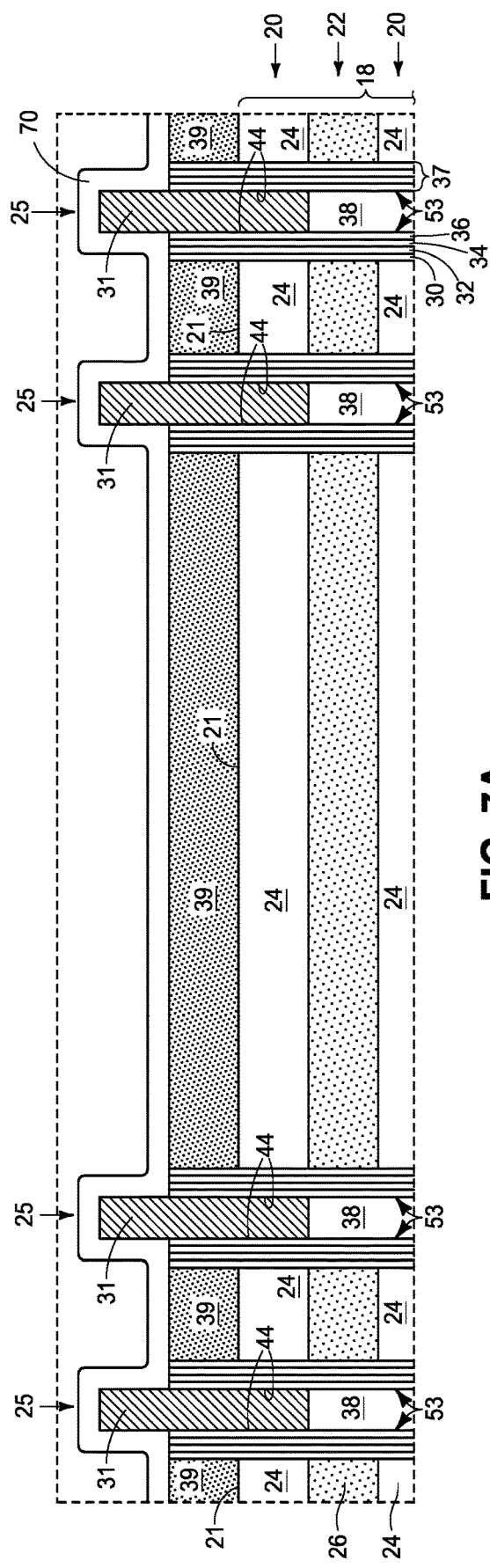

A ring is formed that comprises insulating material that is individually circumferentially about the upwardly-projecting conducting material. An example method for forming such a ring is described with reference to FIGS. 6-9A. Referring to FIGS. 6, 7, and 7A, a layer of insulating material 70 has been blanketly deposited. In one embodiment, insulating material 70 and first insulator material 39 comprise different compositions relative one another. In one embodiment, insulating material 70 comprises at least one of the (a) and the (b). In such embodiment, insulating material 70 may have any of the attributes described above with respect to first insulator material 39. Further, and in one such embodiment, insulating material 70 and first insulator material 39 comprise the same composition relative one another, and in another such embodiment comprise different compositions relative one another.

Figure 8:
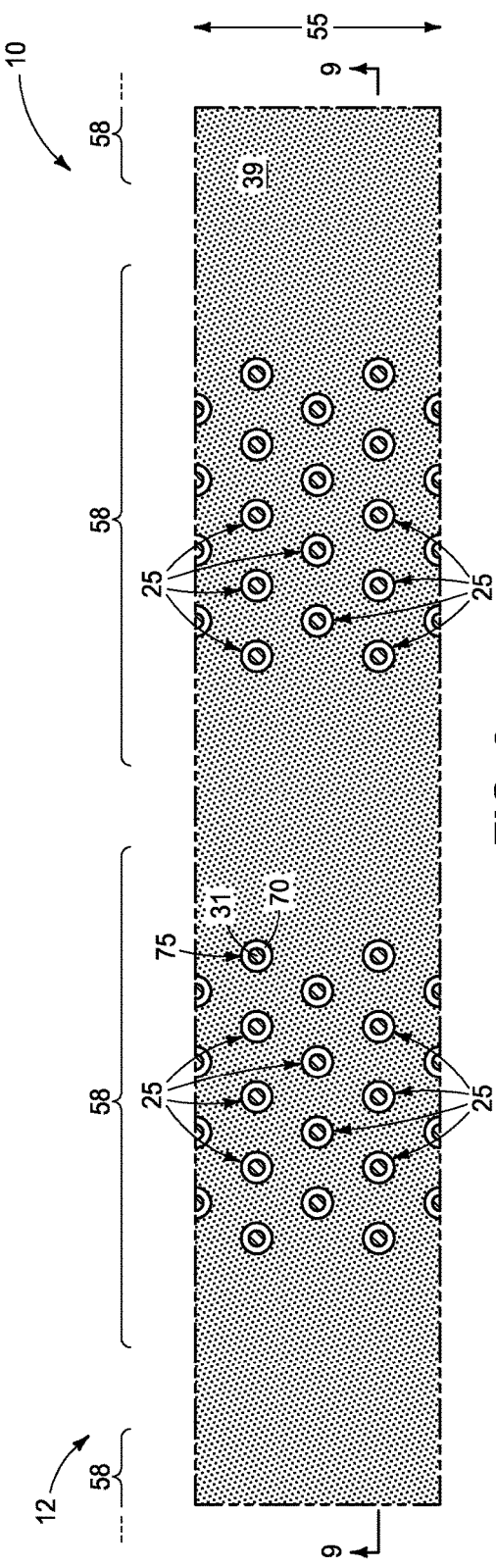
Figure 9:
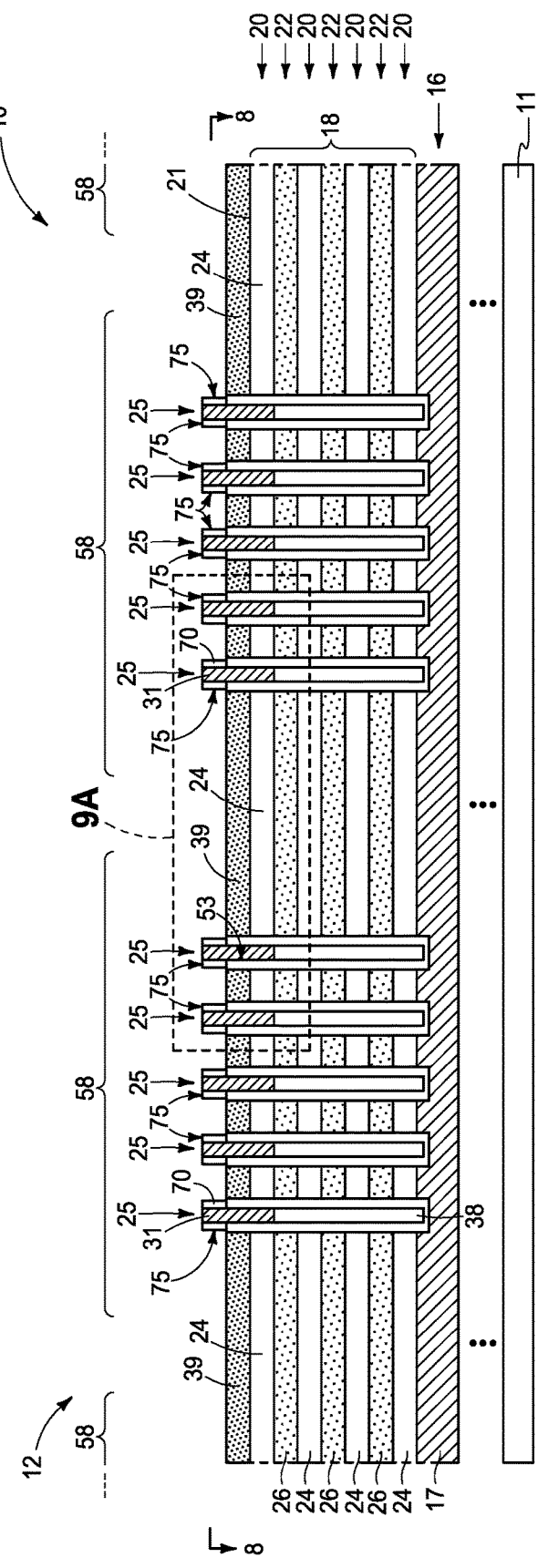
Figure 9A:
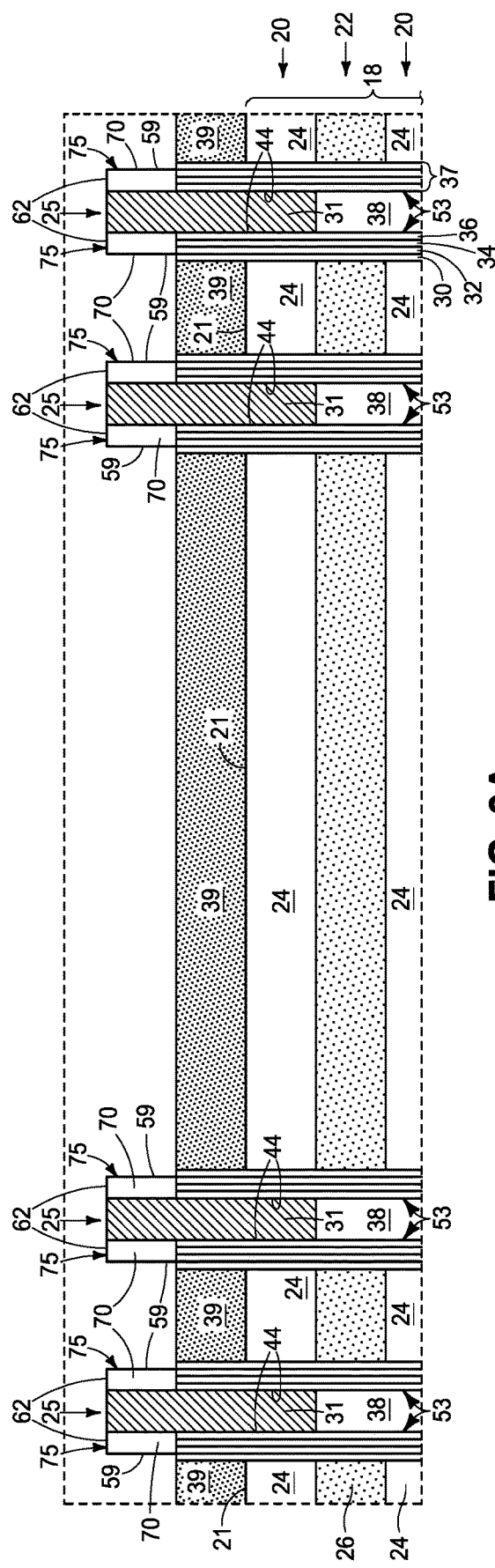

Referring to FIGS. 8, 9, and 9A, insulating material 70 has been anisotropically etched to form a ring 75 comprising insulating material 70 individually circumferentially about upwardly-projecting conducting material 31. Such is but one example only of forming ring 75, and any other existing or future-developed method may be used. In one embodiment and as shown, ring 75 is directly against upwardly-projecting conducting material 31. Ring 75 may be considered as having a top surface 62 and a side surface 59.

Figure 22:
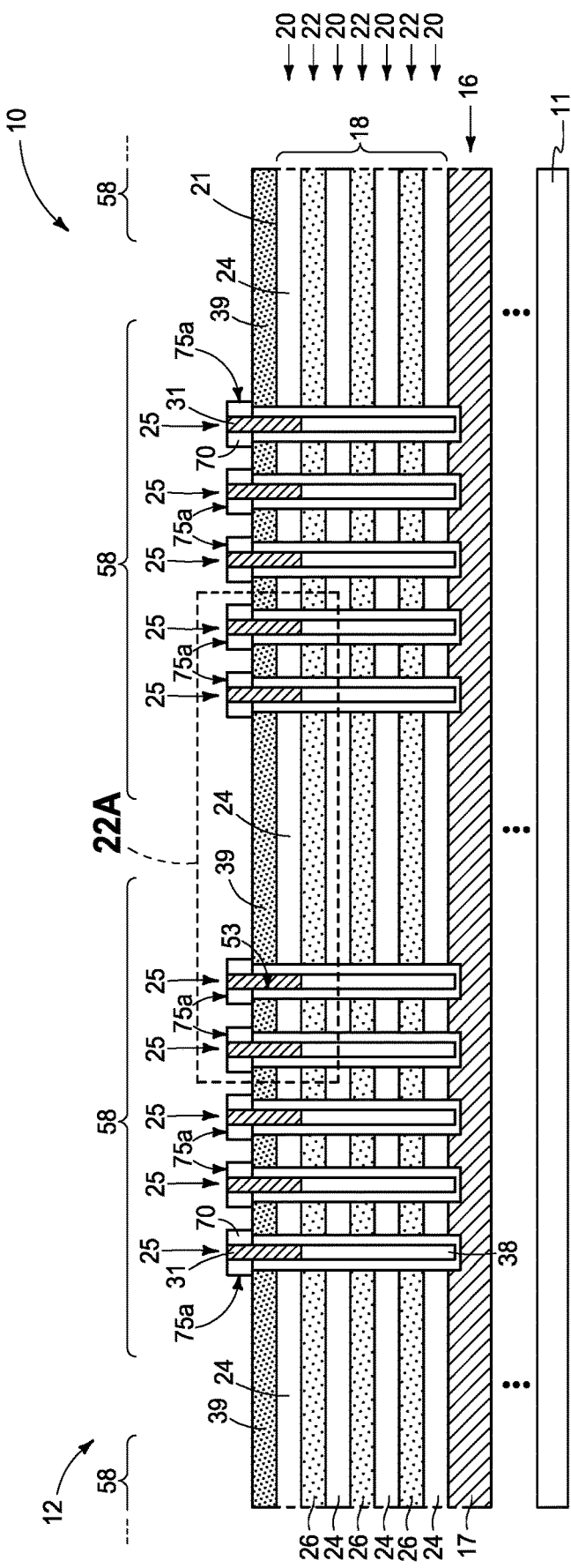
FIGS. 22, 22A, 23, and 23A show alternate example method and/or structural embodiments of the invention.
Figure 22A:
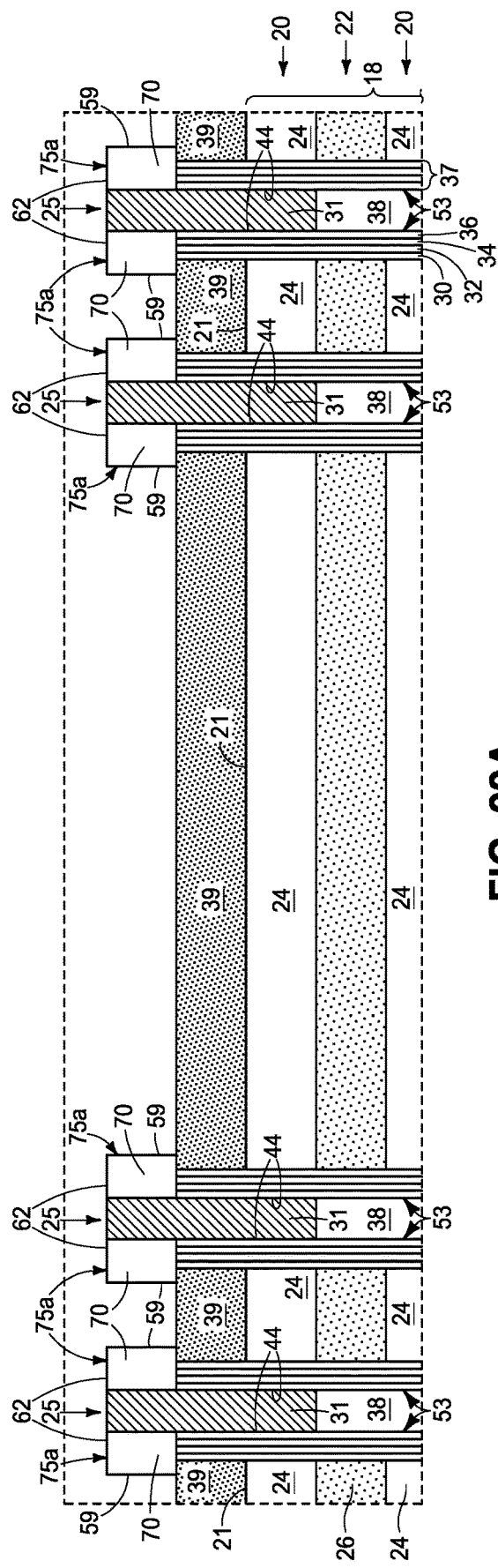

In one embodiment and as shown, ring 75 is not formed directly against first insulator material 39. FIGS. 22 and 22A show an alternate embodiment embodiment construction 10a wherein ring 75a is formed directly against first insulator material 39. Like numerals from the above-described embodiments have been used where appropriate, with some construction differences being indicated with the suffix "a" or with different numerals. Any other attribute(s) or aspect(s) as shown and/or described herein with respect to other embodiments may be used.

Figure 11A:
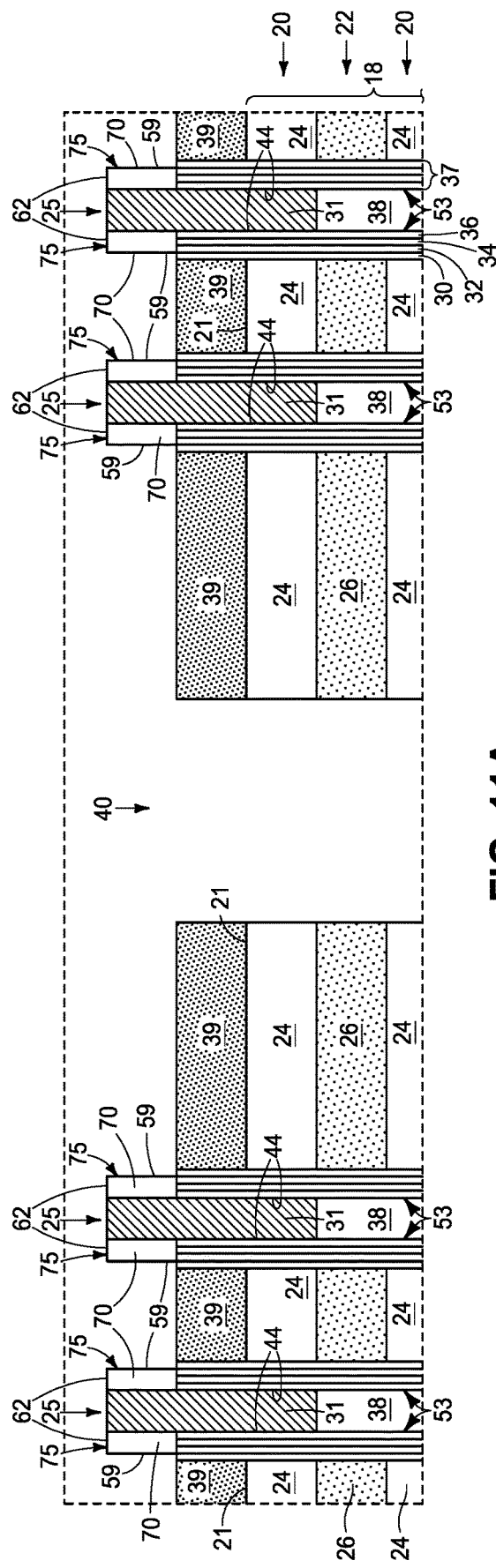
Figure 12:
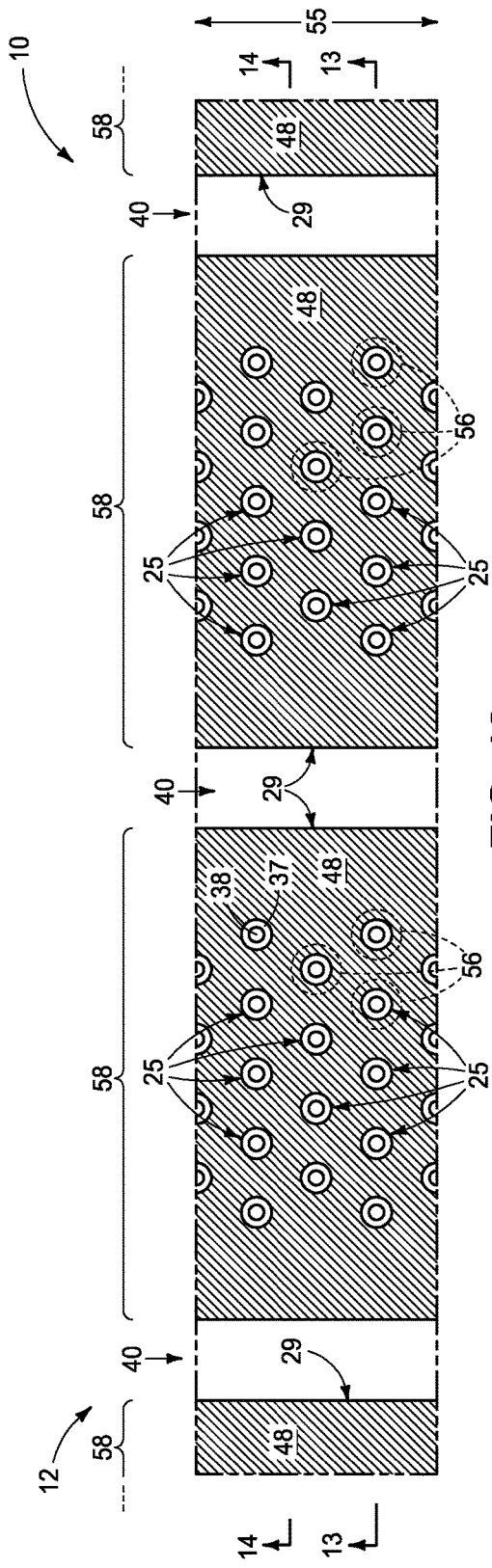
Figure 13:
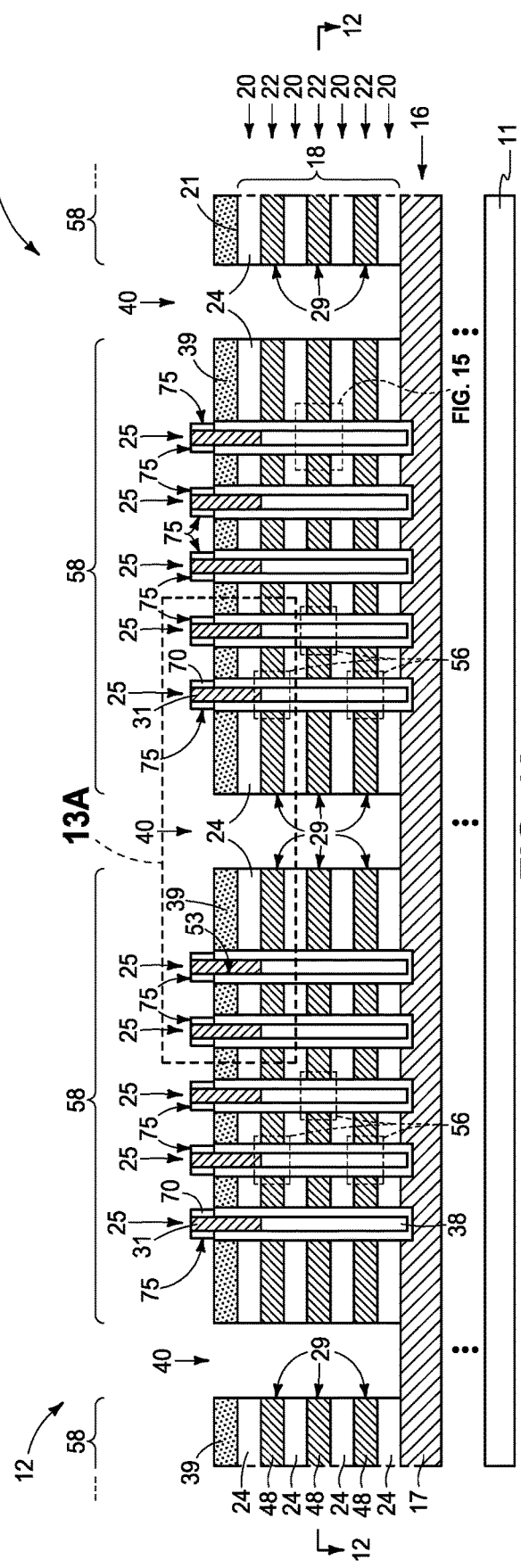
Figure 13A:
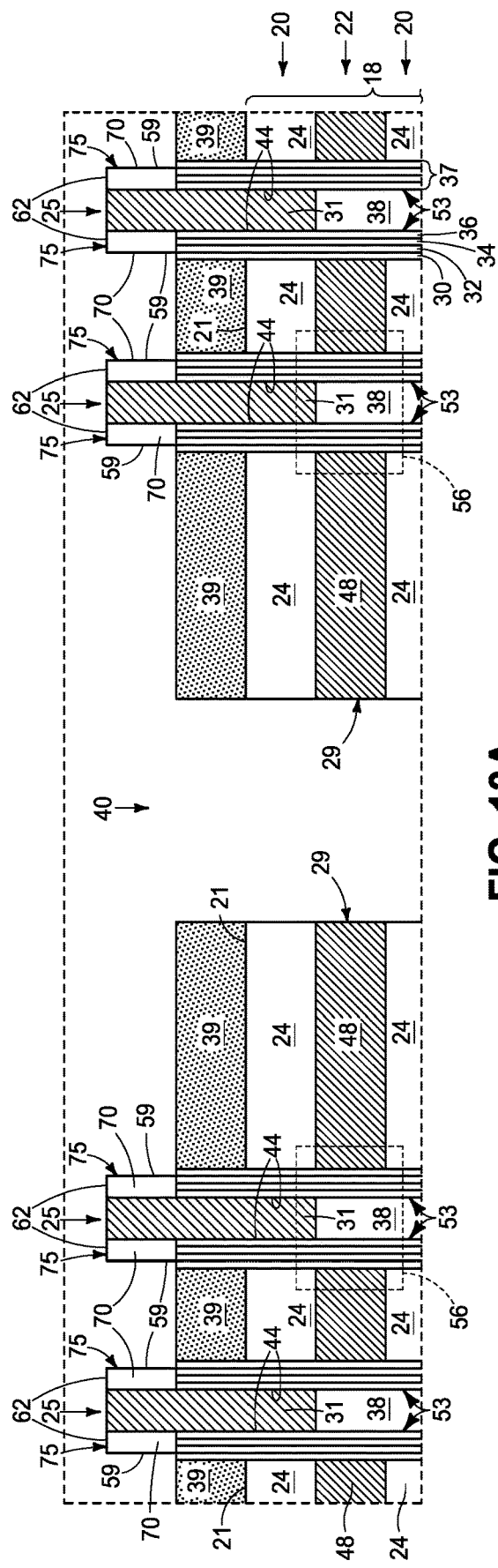
Figure 14:
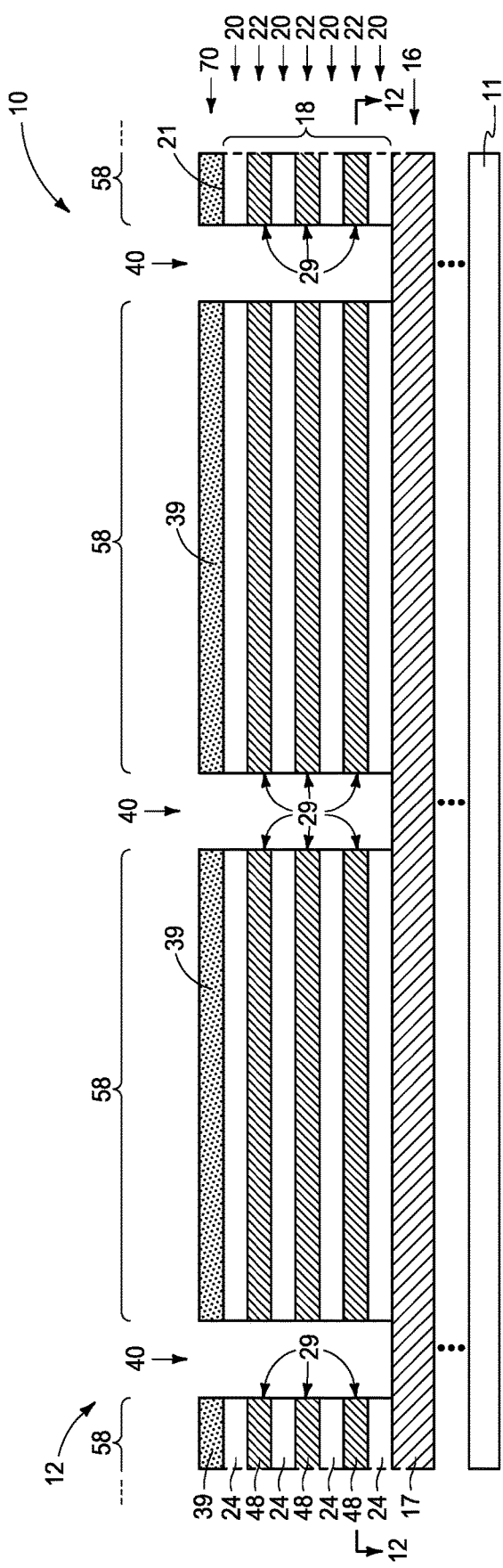
Figure 15:
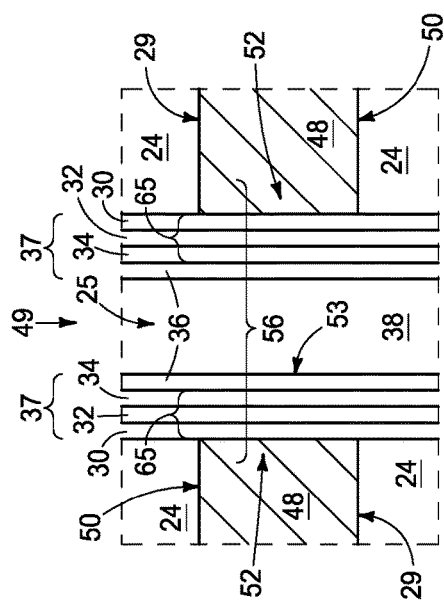

Referring to FIGS. 10, 11, and 11A, horizontally-elongated trenches 40 have been formed (e.g., by anisotropic etching) through first insulator material 39 and into stack 18 to form laterally-spaced memory-block regions 58. Horizontally-elongated trenches 40 may have respective bottoms that are directly against conductive material 17 (atop or within) of conductor tier 16 (as shown) or may have respective bottoms that are above conductive material 17 of conductor tier 16 (not shown).

The above processing shows forming and filling channel openings 25 prior to forming trenches 40. Such could be reversed. Alternately, trenches 40 could be formed in between the forming and filling of channel openings 25 (not ideal).

Referring to FIGS. 12, 13, 13A, 14, and 15, and in one embodiment, material 26 (not shown) of conductive tiers 22 has been removed, for example by being isotropically etched away ideally selectively relative to the other exposed materials (e.g., using liquid or vapor $H_3PO_4$ as a primary etchant where material 26 is silicon nitride, insulating material 70 comprises the (a) and/or the (b), and other materials comprise one or more oxides or polysilicon). Material 26 (not shown) in conductive tiers 22 in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56.

A thin insulative liner (e.g., $Al_2O_3$ and not shown) may be formed before forming conducting material 48. Approximate locations of transistors and/or memory cells 56 are indicated with a bracket in FIG. 15 and some with dashed outlines in FIGS. 12, 13, and 13A, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 15) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming channel openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Referring to FIGS. 16, 17, 17A, and 18, and in one embodiment, intervening material 57 has been formed in trenches 40 between immediately-laterally-adjacent memory-block regions 58. Intervening material 57 may provide lateral electrical isolation (insulation) between immediately-laterally-adjacent memory-block regions 58 and ultimate memory blocks 58. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. In one embodiment, intervening material 57 comprises a laterally-outermost insulative material (e.g., silicon dioxide and/or silicon nitride and not shown) and a laterally-inner material (e.g., undoped polysilicon and not shown) of different composition from that of the laterally-outermost insulative material. In one such embodiment, the laterally-inner material is insulative. In one embodiment, intervening material 57 is everywhere insulative between the immediately-laterally-adjacent memory blocks.

Figure 19:
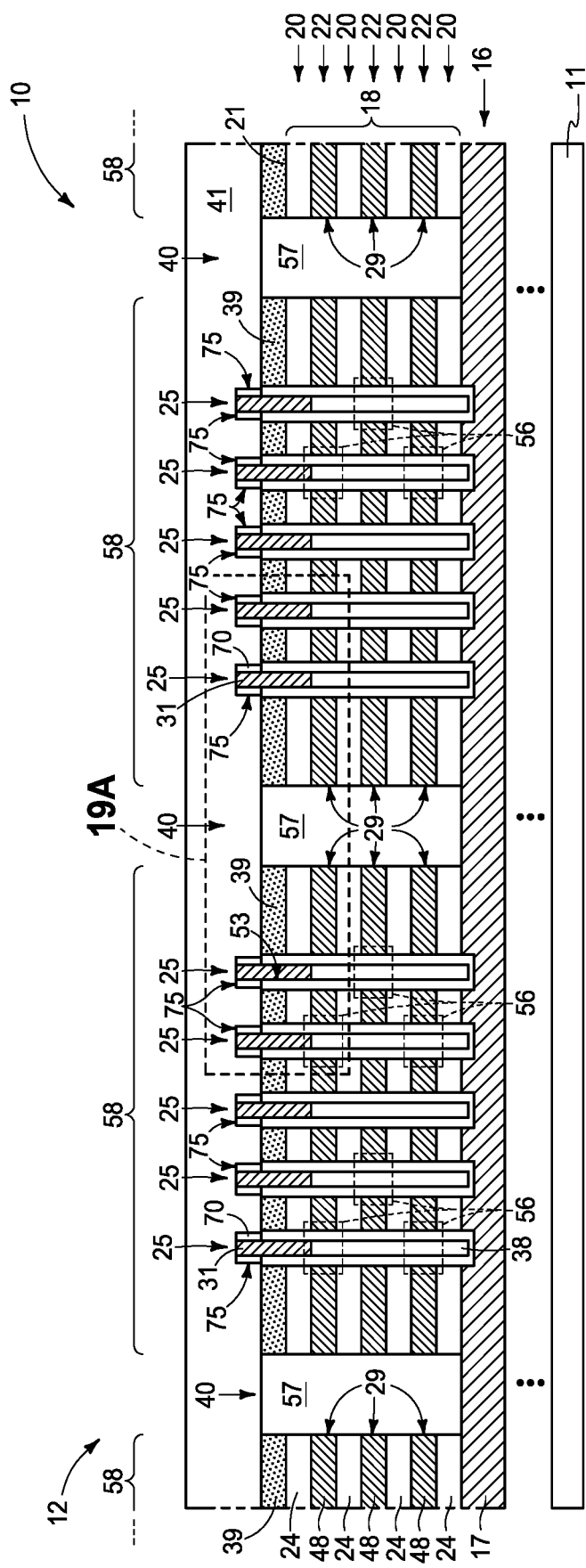
Figure 19A:
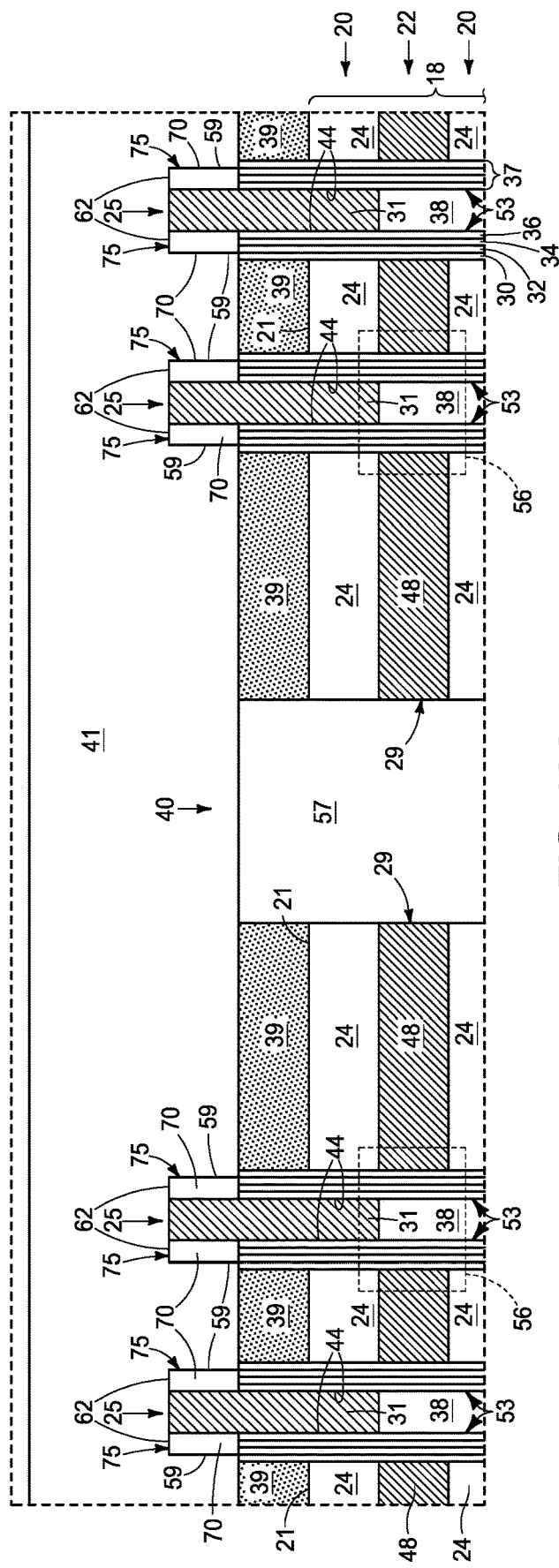

Referring to FIGS. 19 and 19A, second insulator material 41 has been formed above first insulator material 39, intervening material 57, ring 75, and upwardly-projecting conducting material 31. First insulator material 39 and second insulator material 41 comprise different compositions relative one another, with one example second insulator material 41 being silicon dioxide. Regardless, second insulator material 41 may comprise the same composition as at least some of memory-cell materials 30, 32, and/or 34. In one embodiment, second insulator material 41 is formed aside ring 75 and in one such embodiment as shown is formed directly against a side surface 59 of ring 75.

Figure 20:
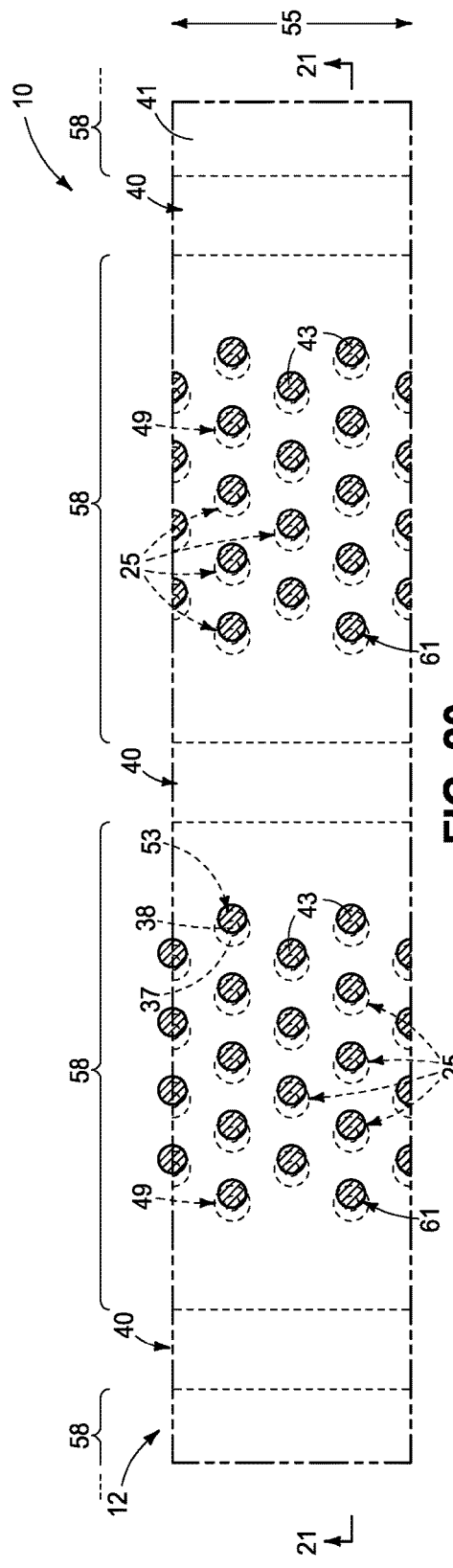
Figure 21:
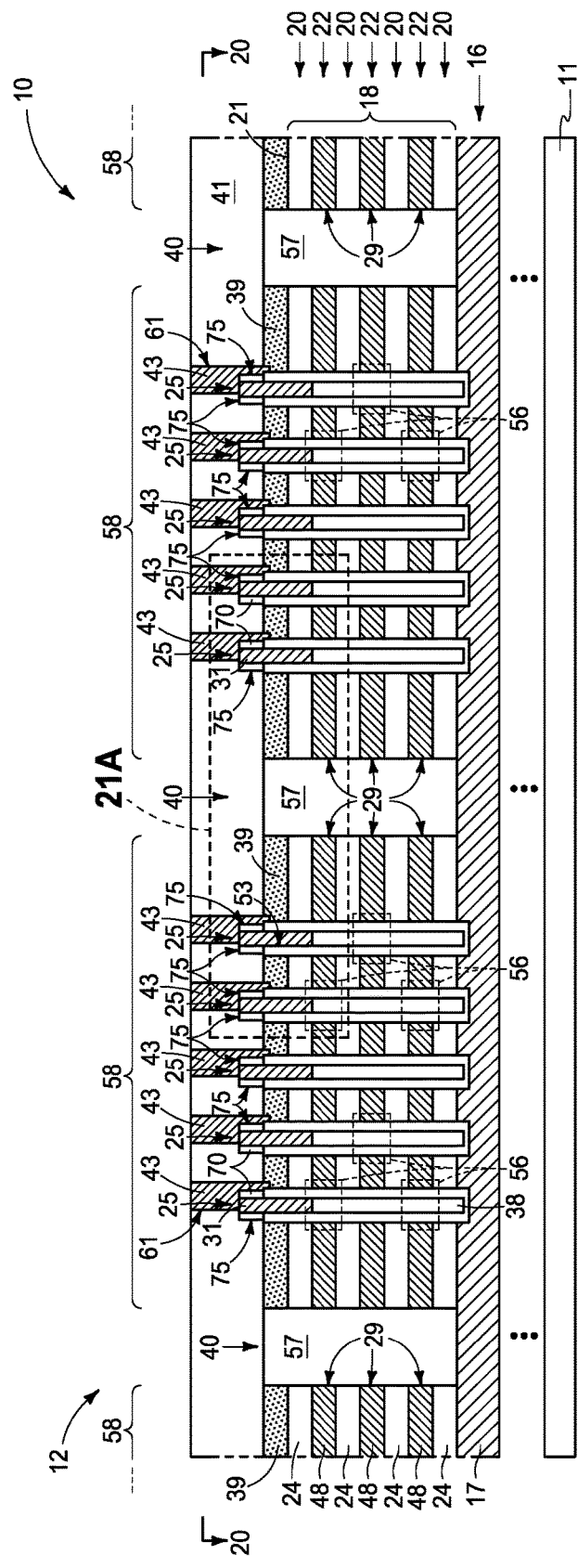
Figure 21A:
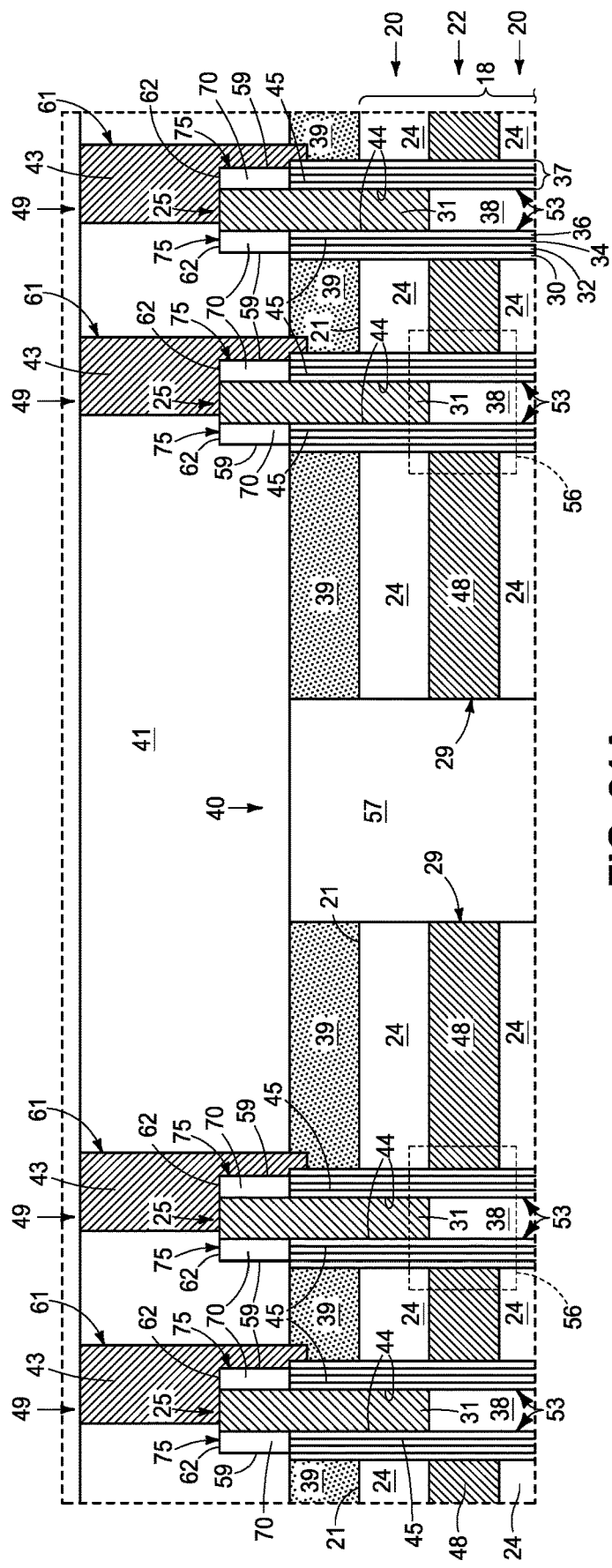

Referring to FIGS. 20, 21, and 21A, contact openings 61 have been formed through second insulator material 41 (e.g., by etching) and thereafter conductive vias 43 have been formed therein and that individually are directly electrically coupled to individual channel-material strings 53 through upwardly-projecting conducting material 31. In one embodiment and as shown, conductive vias 43 are formed aside ring 75 and in one such embodiment are formed directly against a side surface 59 of ring 75. In one embodiment and as shown, conductive vias 43 are formed atop ring 75 and in one such embodiment are formed directly against a top surface 62 of ring 75. In one embodiment and as shown, conductive vias 43 have been formed to extend into first insulator material 39 in part due to the example-depicted mask misalignment. Trenches 40 and/or intervening fill material 57 therein may alternately be formed sometime after forming second insulator material 41, including sometime after forming contact openings 61 and/or conductive vias 43 therein.

Any other attribute(s) or aspect(s) as shown and/or described herein with respect to other embodiments may be used with respect to the above-described embodiments.

Figure 23:
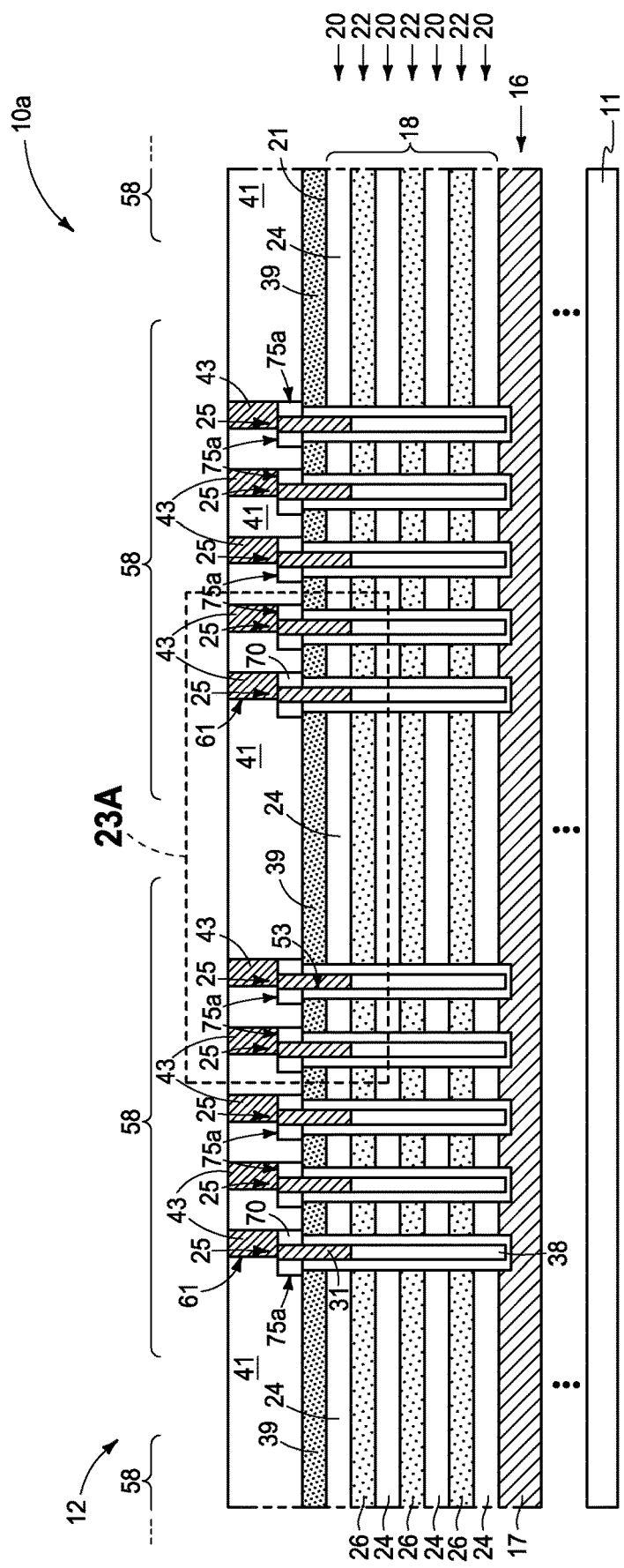
Figure 23A:
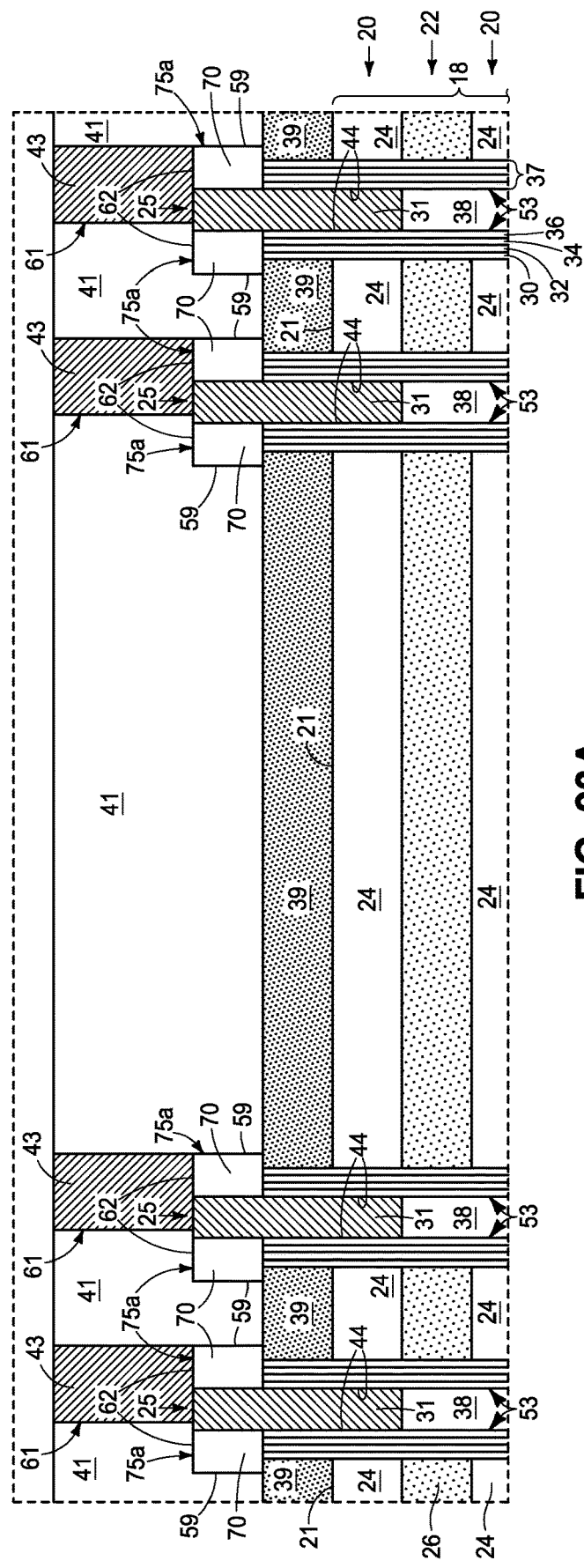

FIGS. 23 and 23A show an example final construction with respect to construction 10a. Any other attribute(s) or aspect(s) as shown and/or described herein with respect to other embodiments may be used.

The invention was motivated in addressing the following processing challenge, but is not so limited. Consider the situation where second insulator material 41 and some of memory-cell materials 30, 32, and/or 34 comprise the same material, for example silicon dioxide. In the absence of ring 75, the etching chemistry used to etch contact openings 61 may also etch such memory-cell material(s) through a slightly mis-aligned mask that could extend the contact openings to conducting material 48 of conductive lines 29 (not shown), thus creating a fatal short when forming conductive vias 43. Ring 75 may preclude or at least reduce such risk.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

Embodiments of the invention include a memory array (e.g., 12) comprising strings (e.g., 49) of memory cells (e.g., 56). The memory array comprises a vertical stack (e.g., 18) comprising alternating insulative tiers (e.g., 20) and conductive tiers (e.g., 22). Channel-material strings (e.g., 53) of memory cells are in the stack and project upwardly above the stack. Conducting material (e.g., 31) is directly against laterally-inner sides (e.g., 44) of individual of the upwardly-projecting channel-material strings and projects upwardly from the individual upwardly-projecting channel-material strings. A first insulator material (e.g., 39) is above the stack aside laterally-outer sides of the channel-material strings (e.g., aside laterally-outer sides 45 designated in FIG. 21A, yet in one embodiment and as shown not directly thereagainst). The first insulator material comprises at least one of (a) and (b), where (a): silicon, nitrogen, and one or more of carbon, oxygen, boron, and phosphorus, and (b): silicon carbide A ring (e.g., 75, 75a) comprising insulating material (e.g., 70) is individually circumferentially about the upwardly-projecting conducting material. Second insulator material (e.g., 41) is above the first insulator material, the ring, and the upwardly-projecting conducting material. The first and second insulator materials comprise different compositions relative one another. Conductive vias (e.g., 43) are in the second insulator material and are individually directly electrically coupled to the individual channel-material strings through the upwardly-projecting conducting material. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprises forming a stack comprising vertically-alternating first tiers and second tiers. First insulator material is above the stack. The first insulator material comprises at least one of (a) and (b), where (a): silicon, nitrogen, and one or more of carbon, oxygen, boron, and phosphorus, and (b): silicon carbide. Channel-material strings are in and upwardly project from an uppermost material that is directly above the stack. Conducting material is directly against laterally-inner sides of individual of the upwardly-projecting channel-material strings and project upwardly from the individual upwardly-projecting channel-material strings. A ring comprising insulating material is formed individually circumferentially about the upwardly-projecting conducting material. Second insulator material is formed above the first insulator material, the ring, and the upwardly-projecting conducting material. The first and second insulator materials comprise different compositions relative one another. Conductive vias are formed in the second insulator material that are individually directly electrically coupled to the individual channel-material strings through the upwardly-projecting conducting material.

In some embodiments, a method used in forming a memory array comprises forming a stack comprising vertically-alternating first tiers and second tiers. First insulator material is formed above the stack. The first insulator material comprises at least one of (a) and (b), where (a): silicon, nitrogen, and one or more of carbon, oxygen, boron, and phosphorus, and (b): silicon carbide. Channel-material strings are forming in and project upwardly from an uppermost material that is directly above the stack. The channel-material strings individually have memory-cell materials there-along. Conducting material is directly against laterally-inner sides of individual of the upwardly-projecting channel-material strings. Channel material of the channel-material strings is vertically recessed and the memory-cell materials are vertically recessed to form the conducting material to project upwardly from the individual upwardly-projecting channel-material strings. A ring comprising insulating material is formed individually circumferentially about and directly against the upwardly-projecting conducting material. Second insulator material is formed above the first insulator material, the ring, and the upwardly-projecting conducting material. The first and second insulator materials comprise different compositions relative one another. Conductive vias are formed in the second insulator material that are individually directly electrically coupled to the individual channel-material strings through the upwardly-projecting conducting material.

In some embodiments, a memory array comprises a vertical stack comprising alternating insulative tiers and conductive tiers. Channel-material strings of memory cells are in the stack. The channel-material strings project upwardly above the stack. Conducting material is directly against laterally-inner sides of individual of the upwardly-projecting channel-material strings and project upwardly from the individual upwardly-projecting channel-material strings. A first insulator material is above the stack aside laterally-outer sides of the channel-material strings. The first insulator material comprises at least one of (a) and (b), where (a): silicon, nitrogen, and one or more of carbon, oxygen, boron, and phosphorus, and (b): silicon carbide. A ring comprising insulating material is individually circumferentially about the upwardly-projecting conducting material. Second insulator material is above the first insulator material, the ring, and the upwardly-projecting conducting material. The first and second insulator materials comprise different compositions relative one another. Conductive vias in the second insulator material are individually directly electrically coupled to the individual channel-material strings through the upwardly-projecting conducting material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array, comprising:
   forming a stack comprising vertically-alternating first tiers and second tiers, first insulator material being above the stack; the first insulator material comprising at least one of (a) and (b), where (a): silicon, nitrogen, and one or more of carbon, oxygen, boron, and phosphorus, and (b): silicon carbide; channel-material strings being in and upwardly projecting from an uppermost material that is directly above the stack, conducting material being directly against laterally-inner sides of individual of the upwardly-projecting channel-material strings and projecting upwardly from the individual upwardly-projecting channel-material strings;
   forming a ring comprising insulating material individually circumferentially about the upwardly-projecting conducting material;
   forming second insulator material above the first insulator material, the ring, and the upwardly-projecting conducting material; the first and second insulator materials comprising different compositions relative one another; and
   forming conductive vias in the second insulator material that are individually directly electrically coupled to the individual channel-material strings through the upwardly-projecting conducting material.

2. The method of claim 1 wherein the second insulator material is formed aside the ring.

3. The method of claim 2 wherein the second insulator material is formed directly against a side surface of the ring.

4. The method of claim 1 wherein the ring is formed directly against the upwardly-projecting conducting material.

5. The method of claim 1 wherein the conductive vias are formed aside the ring.

6. The method of claim 5 wherein the conductive vias are formed directly against a side surface of the ring.

7. The method of claim 1 wherein the conductive vias are formed atop the ring.

8. The method of claim 7 wherein the conductive vias are formed directly against a top surface of the ring.

9. The method of claim 8 wherein the conductive vias are formed directly against a side surface of the ring.

10. The method of claim 1 comprising forming the ring directly against the first insulator material.

11. The method of claim 1 wherein the ring is not formed directly against the first insulator material.

12. The method of claim 1 comprising forming the conductive vias to extend vertically into the first insulator material.

13. The method of claim 1 wherein the insulating material and the first insulator material comprise different compositions relative one another.

14. The method of claim 1 wherein the at least one comprises the (a).

15. The method of claim 14 wherein said one or more of carbon, oxygen, boron, and phosphorus in the first insulator material has a total concentration of at least about 2 atomic percent.

16. The method of claim 15 wherein said total concentration is no more than about 20 atomic percent.

17. The method of claim 15 wherein said one or more of carbon, oxygen, boron, and phosphorus in the first insulator material has a total concentration of at least about 4 atomic percent.

18. The method of claim 17 wherein said total concentration is at least about 10 atomic percent.

19. The method of claim 14 wherein the one or more comprises carbon.

20. The method of claim 14 wherein the one or more comprises oxygen.

21. The method of claim 14 wherein the one or more comprises boron.

22. The method of claim 14 wherein the one or more comprises phosphorus.

23. The method of claim 14 wherein the one or more comprises only one of carbon, oxygen, boron, and phosphorus.

24. The method of claim 14 wherein the one or more comprises at least two of carbon, oxygen, boron, and phosphorus.

25. The method of claim 1 wherein the at least one comprises the (b).

26. The method of claim 1 wherein the at least one comprises both the (a) and the (b).

27. The method of claim 1 wherein the insulating material comprises at least one of the (a) and the (b).

28. The method of claim 27 wherein the insulating material and the first insulator material comprise different compositions relative one another.

29. The method of claim 27 wherein the insulating material and the first insulator material comprise the same composition relative one another.

30. The method of claim 1 wherein the insulating material comprises the (a).

31. The method of claim 1 wherein the insulating material comprises the (b).

32. The method of claim 1 wherein the insulating material comprises both of the (a) and the (b).

33. The method of claim 1 comprising forming horizontally-elongated trenches through the first insulator material and into the stack to form laterally-spaced memory-block regions and forming intervening material in the trenches.

34. The method of claim 1 comprising:
forming the first tiers to comprise sacrificial material;
etching the sacrificial material away from the first tiers selectively relative to the second tiers; and
replacing the sacrificial material from the first tiers with conducting material of individual conductive lines in the first tiers.

35. A method used in forming a memory array, comprising:
forming a stack comprising vertically-alternating first tiers and second tiers;
forming first insulator material above the stack, the first insulator material comprising at least one of (a) and (b), where (a): silicon, nitrogen, and one or more of carbon, oxygen, boron, and phosphorus, and (b): silicon carbide;
forming channel-material strings in and projecting upwardly from an uppermost material that is directly above the stack, the channel-material strings individually having memory-cell materials there-along, conducting material being directly against laterally-inner sides of individual of the upwardly-projecting channel-material strings;
vertically-recessing channel material of the channel-material strings and vertically-recessing the memory-cell materials to form the conducting material to project upwardly from the individual upwardly-projecting channel-material strings;
forming a ring comprising insulating material individually circumferentially about and directly against the upwardly-projecting conducting material;
forming second insulator material above the first insulator material, the ring, and the upwardly-projecting conducting material; the first and second insulator materials comprising different compositions relative one another; and
forming conductive vias in the second insulator material that are individually directly electrically coupled to the individual channel-material strings through the upwardly-projecting conducting material.

* * * * *